(12) United States Patent
Cheng et al.

(10) Patent No.: US 12,160,236 B2
(45) Date of Patent: Dec. 3, 2024

(54) REFERENCE VOLTAGE CIRCUIT WITH TEMPERATURE COMPENSATION

(71) Applicant: INFSITRONIX TECHNOLOGY CORPORATION, Jhubei (TW)

(72) Inventors: Yuan-Kai Cheng, Jhubei (TW); Chung-Jye Hsu, Jhubei (TW)

(73) Assignee: Infsitronix Technology Corporation, Jhubei (TW)

(*) Notice: Subject to any disclaimer, the term of this patent is extended or adjusted under 35 U.S.C. 154(b) by 0 days.

(21) Appl. No.: 17/661,093

(22) Filed: Apr. 28, 2022

(65) Prior Publication Data
US 2023/0336174 A1    Oct. 19, 2023

Related U.S. Application Data

(60) Provisional application No. 63/180,751, filed on Apr. 28, 2021.

(51) Int. Cl.
| H03K 19/003 | (2006.01) |
| H03K 19/08 | (2006.01) |
| H03K 19/17784 | (2020.01) |

(52) U.S. Cl.
CPC ... *H03K 19/00369* (2013.01); *H03K 19/0813* (2013.01); *H03K 19/17784* (2013.01)

(58) Field of Classification Search
None
See application file for complete search history.

(56) References Cited

U.S. PATENT DOCUMENTS

| 5,621,307 | A | 4/1997 | Beggs |
| 6,529,066 | B1 * | 3/2003 | Guenot ............ G05F 3/30 |
| | | | 327/512 |
| 2003/0155899 | A1 | 8/2003 | Oglesbee et al. |
| 2008/0001648 | A1 * | 1/2008 | Lin .................. G05F 1/567 |
| | | | 327/513 |
| 2008/0297229 | A1 | 12/2008 | Ramamoorthy |
| 2010/0127687 | A1 | 5/2010 | Boas et al. |
| 2010/0259315 | A1 | 10/2010 | Lin |
| 2012/0068685 | A1 * | 3/2012 | Chang ............... G05F 3/30 |
| | | | 323/313 |

(Continued)

FOREIGN PATENT DOCUMENTS

| CN | 1758176 A | 4/2006 |
| CN | 101042591 A | 9/2007 |

(Continued)

OTHER PUBLICATIONS

First Office Action issued to counterpart Taiwanese Application No. 111116227 dated Mar. 2, 2023.

(Continued)

*Primary Examiner* — Jany Richardson
(74) *Attorney, Agent, or Firm* — Rosenberg, Klein & Lee

(57) ABSTRACT

The present application discloses a reference voltage circuit with temperature compensation, in which a voltage with a positive temperature coefficient is provided by a current source and an impedance device, and in the meanwhile, a voltage with a negative temperature coefficient is provided by a voltage source. Hereby, the reference voltage circuit according to the invention provides a reference voltage with temperature compensation at an output terminal.

18 Claims, 36 Drawing Sheets

(56) References Cited

U.S. PATENT DOCUMENTS

| | | | |
|---|---|---|---|
| 2015/0028922 A1 | 1/2015 | Turkson et al. | |
| 2015/0091537 A1* | 4/2015 | Caffee | G05F 1/575 |
| | | | 323/265 |

FOREIGN PATENT DOCUMENTS

| CN | 101178330 A | 5/2008 |
|---|---|---|
| CN | 101562391 A | 10/2009 |
| CN | 101753115 A | 6/2010 |
| CN | 101859158 A | 10/2010 |
| CN | 102478876 A | 5/2012 |
| CN | 103729009 A | 4/2014 |
| CN | 109412221 A | 3/2019 |
| CN | 110471483 A | 11/2019 |
| CN | 110515417 A | 11/2019 |
| CN | 110941304 A | 3/2020 |
| CN | 112034920 A | 12/2020 |
| CN | 112346507 A | 2/2021 |
| TW | 200532415 A | 10/2005 |
| TW | 200629033 A | 8/2006 |
| TW | 200735524 A | 9/2007 |
| TW | 200912587 A | 3/2009 |
| TW | 200943021 A | 10/2009 |
| TW | 201104381 A | 2/2011 |
| TW | 201413414 A | 4/2014 |
| TW | 201418930 A | 5/2014 |
| TW | I536139 B | 6/2016 |
| TW | 202024841 A | 7/2020 |
| WO | 2020176132 A1 | 9/2020 |

OTHER PUBLICATIONS

Search Report issued to counterpart Taiwanese Application No. 111116227 dated Mar. 2, 2023.
Correction of First Office Action issued to Counterpart Taiwanese Application No. 111116227 dated Mar. 31, 2023.
Office Action mailed to Corresponding Chinese Patent Application No. 202210471351.5 on Aug. 10, 2023.

\* cited by examiner

REFERENCE VOLTAGE CIRCUIT WITH TEMPERATURE COMPENSATION

FIELD OF THE INVENTION

The present application relates generally to a power circuit, and particular to a reference voltage circuit with temperature compensation.

BACKGROUND OF THE INVENTION

In the voltage circuit design, since most circuit devices are semiconductor devices, there are many variables depending on power sources or even materials. Thereby, it is required for circuit design to have a more accurate reference voltage. In the voltage circuit field, bandgap voltage reference circuits are developed to produce a reference voltage for a circuit. Unfortunately, temperature variations will make the reference voltage produced by bandgap voltage reference circuits inaccurate, which will induce errors in the signals of the circuit.

As shown in FIG. 1, the first transistor Q12 and the second transistor Q12 in the reference voltage circuit 10 according to the prior art produce the corresponding output voltage Vout1 as the reference voltage by using the operational amplifier A12 for compensating the influence by temperature. The output voltage Vout1 is expressed in equation (1) below:

$$V\text{out}1 = V_{BEQ14} + \left(1 + \frac{R14}{R16}\right) \times \ln(N) \times V_T \quad (1)$$

$V_T$ is the reference voltage influenced by temperature and compensated by the operational amplifier A12 to have lower temperature sensitivity. Nonetheless, the circuit complexity for the bandgap reference voltage circuit 10 will be increased. Alternatively, as shown in FIG. 2, according to another bandgap reference voltage circuit 20, the reference current $I_{ref}$ flows through the first transistor Q22. The current mirrors formed by the MOS transistors M21~M25 will provide the corresponding current-mirror currents $I_{MQ24}$, $I_{MQ26}$ for the second transistor Q24 and the third transistor Q26. By using a simpler circuit design than operational-amplifier compensation, a reference voltage with a lower temperature coefficient can be provided. The reference voltage is the output voltage Vout2, expressed in equation (2) below:

$$V\text{out}2 = V_{BEQ26} + \left(1 + \frac{R24}{R26}\right) \times \ln(N) \times V_T \quad (2)$$

Nonetheless, the bandgap reference voltage circuits in both FIG. 1 and FIG. 2 cannot reduce the influences by temperature coefficients effectively.

Accordingly, the present application provides a reference voltage circuit with temperature compensation. A current source and an impedance device provide a positive temperature coefficient voltage; a transimpedance device provides a negative temperature coefficient voltage. Thereby, an output terminal of the reference voltage circuit outputs a reference voltage. Since the influence of temperature on the reference voltage is approximately zero, the influence of temperature coefficient on the reference voltage is reduced significantly.

SUMMARY

An objective of the present application is to provide a reference voltage circuit with temperature compensation. A reference voltage is produced by using a positive temperature coefficient voltage and a negative temperature coefficient voltage. Thereby, the influences of temperature on the reference voltage will be cancelled out and thus giving the reference voltage with temperature compensation.

To achieve the above objective, the present application provides a reference voltage circuit with temperature compensation, which comprises a current source, an impedance device, and a transimpedance device. The current source generates a positive temperature coefficient current to the impedance device so that the impedance device provides a positive temperature coefficient voltage to a output terminal coupled to thereof. In addition, the transimpedance device generates a negative temperature coefficient voltage to the output terminal. The positive temperature coefficient voltage cancel out the negative temperature coefficient voltage at the output terminal. When the output terminal outputs a corresponding reference voltage, the influence of temperature on the reference voltage can approach zero.

DETAILED DESCRIPTION

In order to make the structure and characteristics as well as the effectiveness of the present application to be further understood and recognized, the detailed description of the present application is provided as follows along with embodiments and accompanying figures.

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in functions are the guidelines for distinguishing. In the whole specifications and subsequent claims, the word "comprising" is an open language and should be explained as "comprising but not limited to". Besides, the word "couple" includes any direct and indirect electrical connection. Thereby, if the description is that a first device is coupled to a second device, it means that the first device is connected electrically to the second device directly, or the first device is connected electrically to the second device via other device or connecting means indirectly.

The bandgap reference voltage circuit according to the prior art cannot lower the influences by temperature coefficients and the circuit design is more complex.

According to the present application, the influences by temperature coefficients can be cancelled out by using positive and negative temperature coefficient voltages. Namely, a impedance device is used to generate a voltage proportional to absolute temperature $V_{PTAT}$ and a transimpedance device is used to generate a voltage complementary to absolute temperature $V_{CTAT}$ for canceling out the influences by temperature variation. Thereby, the influence of temperature coefficient on the reference voltage produced by a reference voltage circuit, which is also called a bandgap reference voltage circuit, can be improved. Besides, the present application can reduce circuit complexity effectively.

In the following description, various embodiments of the present application are described using figures for describing the present application in detail. Nonetheless, the concepts of the present application can be embodied by various forms. Those embodiments are not used to limit the scope and range of the present application.

Figure 1:
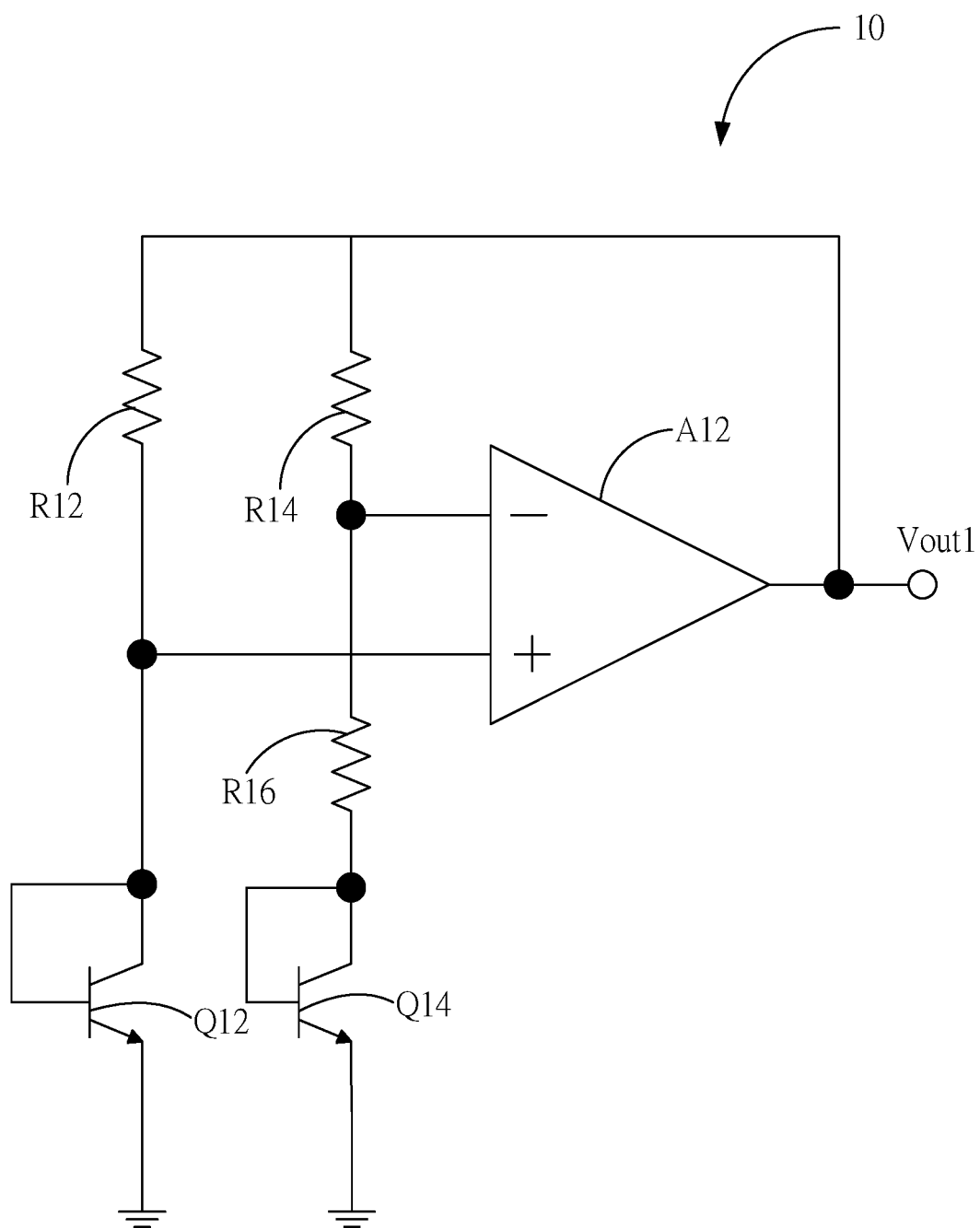
FIG. 1 shows a circuit diagram of the bandgap reference voltage circuit according to the prior art.
Figure 2:
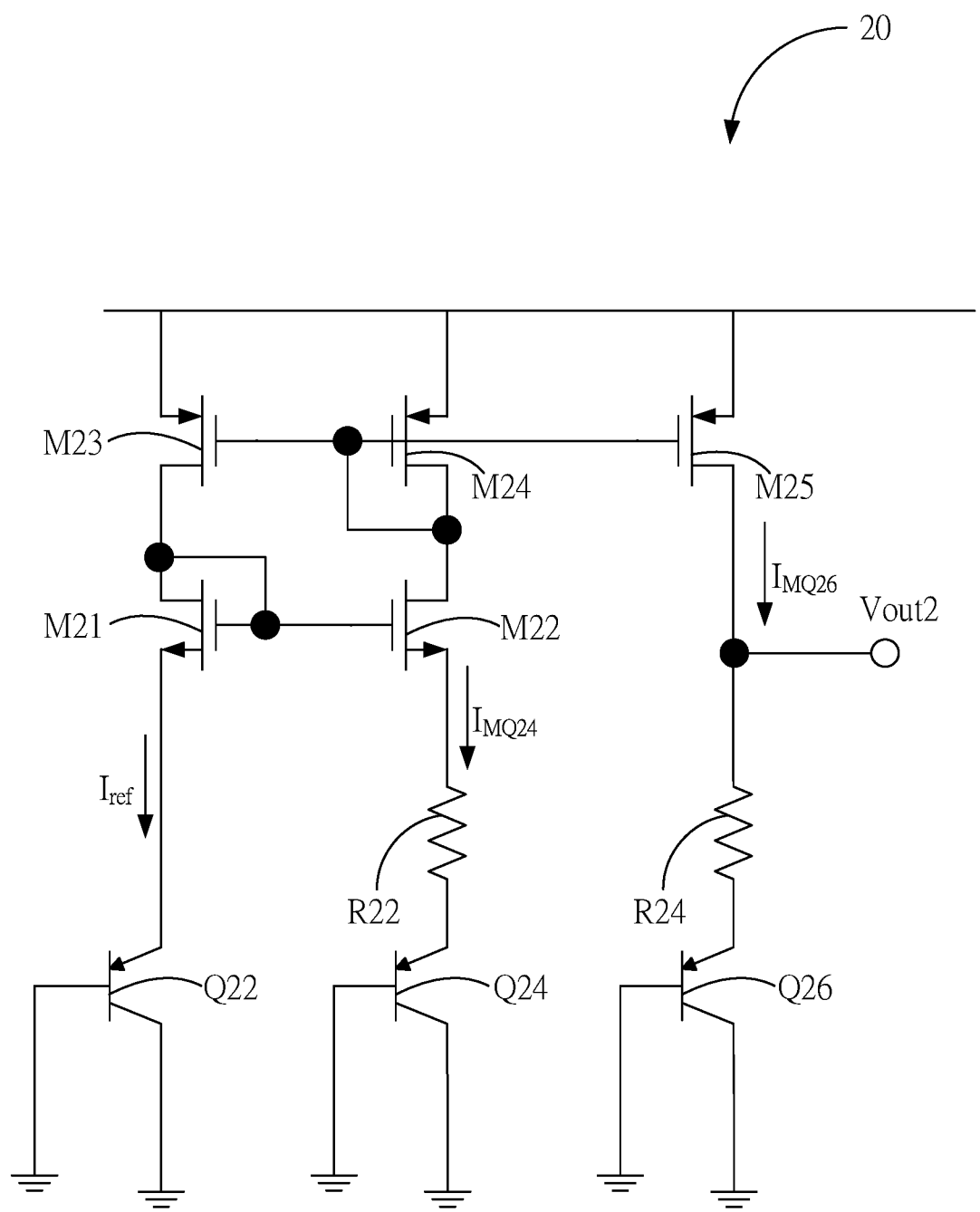
FIG. 2 shows another circuit diagram of the bandgap reference voltage circuit according to the prior art.
Figure 3:
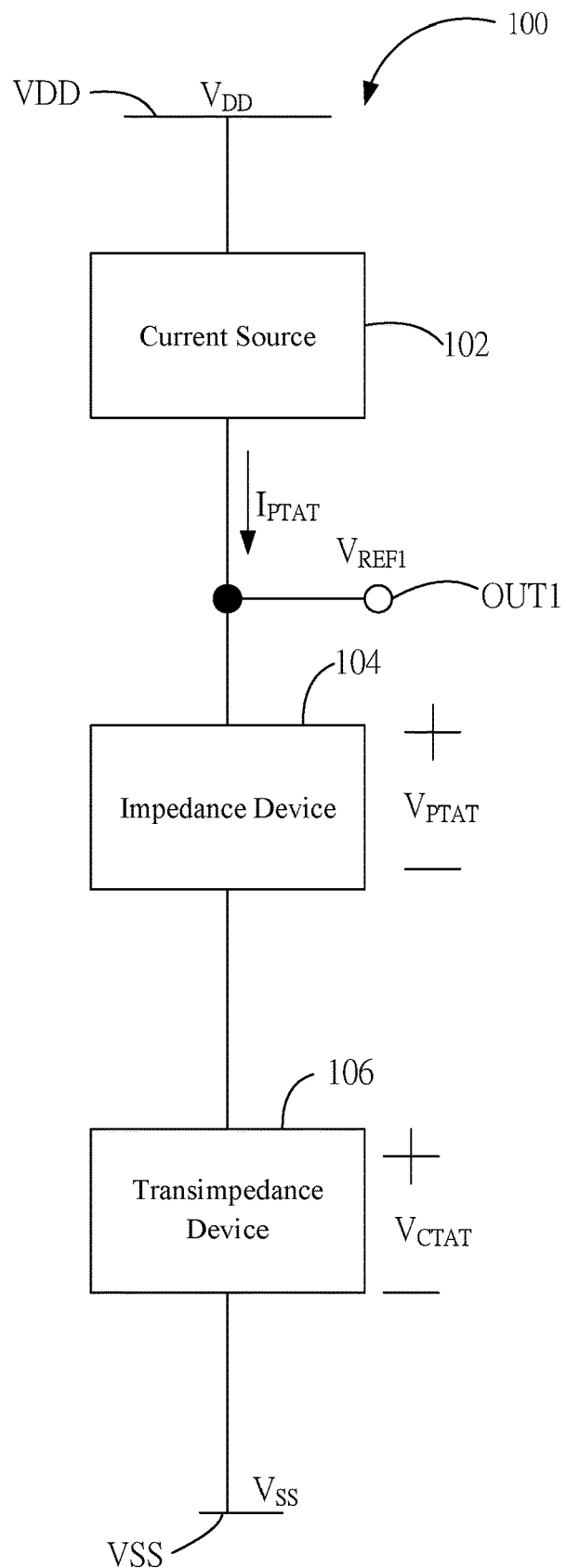
FIG. 3 shows a schematic diagram of the reference voltage circuit according to the first embodiment of the present application.

First, please refer to FIG. 3, which shows a schematic diagram of the reference voltage circuit according to the first embodiment of the present application. As shown in the figure, the reference voltage circuit 100 according to the present embodiment is a low-side bandgap reference voltage circuit comprising a current source 102, an impedance device 104, and a transimpedance device 106. The current source 102 is coupled between a first voltage terminal VDD and the impedance device 104. The transimpedance device 106 is coupled between the impedance device 104 and a second voltage terminal VSS. The current source 102 generates a positive temperature coefficient current $I_{PTAT}$ to the impedance device 104. The impedance device 104 generates a positive temperature coefficient voltage $V_{PTAT}$ according to the positive temperature coefficient current $I_{PTAT}$. The transimpedance device 106 generates a negative temperature coefficient voltage $V_{CTAT}$. Thereby, the reference voltage circuit 100 provides a first reference voltage $V_{REF1}$ at an output terminal OUT1 formed by the positive temperature coefficient voltage $V_{PTAT}$ and the negative temperature coefficient voltage $V_{CTAT}$.

Figure 4:
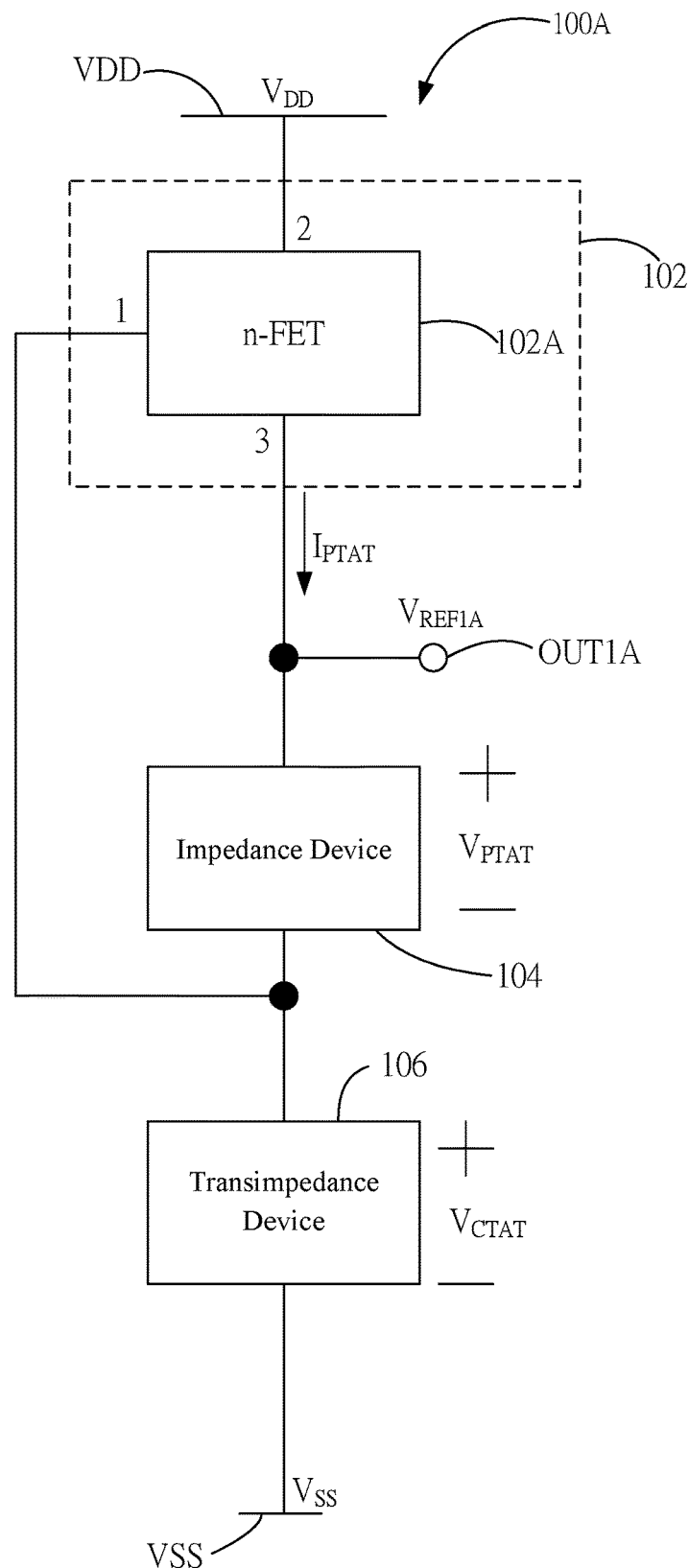
FIG. 4 shows a schematic diagram of the reference voltage circuit according to an embodiment of FIG. 3.

Furthermore, please refer to FIG. 4, which shows a schematic diagram of the reference voltage circuit according to an embodiment of FIG. 3. As shown in the figure, the reference voltage circuit 100A according to the present embodiment is the detailed circuit of the reference voltage circuit 100 of the first embodiment. The current source 102 according to the present embodiment is an n-FET (n-type field-effect transistor) 102A. The first terminal of the n-FET 102A is coupled between the impedance device 104 and the transimpedance device 106; the second terminal of the n-FET 102A is coupled to the first voltage terminal VDD for receiving a first voltage $V_{DD}$; the third terminal of the n-FET 102A is coupled to the impedance device 104. The transimpedance device 106 is coupled between the impedance device 104 and the second voltage terminal VSS. The n-FET 102A acquires a negative threshold voltage at the first terminal from the transimpedance device 106 and generates the positive coefficient current $I_{PTAT}$ at the third terminal. The positive coefficient current $I_{PTAT}$ flows through the impedance device 104 to generate the positive temperature coefficient voltage $V_{PTAT}$. The transimpedance device 106 generates the negative temperature coefficient voltage $V_{CTAT}$ using the second voltage $V_{SS}$ of the second voltage terminal VSS. Thereby, the reference voltage $V_{REF1A}$ generated at the output terminal OUT1A of the reference voltage circuit 100A is expressed in equation (3):

$$V_{REF1A} = V_{SS} + V_{CTAT} + V_{PTAT} \quad (3)$$

According to equation (3), in the present embodiment, the influences by temperature coefficients on the reference voltage are eliminated by using the positive temperature coefficient voltage $V_{PTAT}$ and the negative temperature coefficient voltage $V_{CTAT}$.

Figure 5:
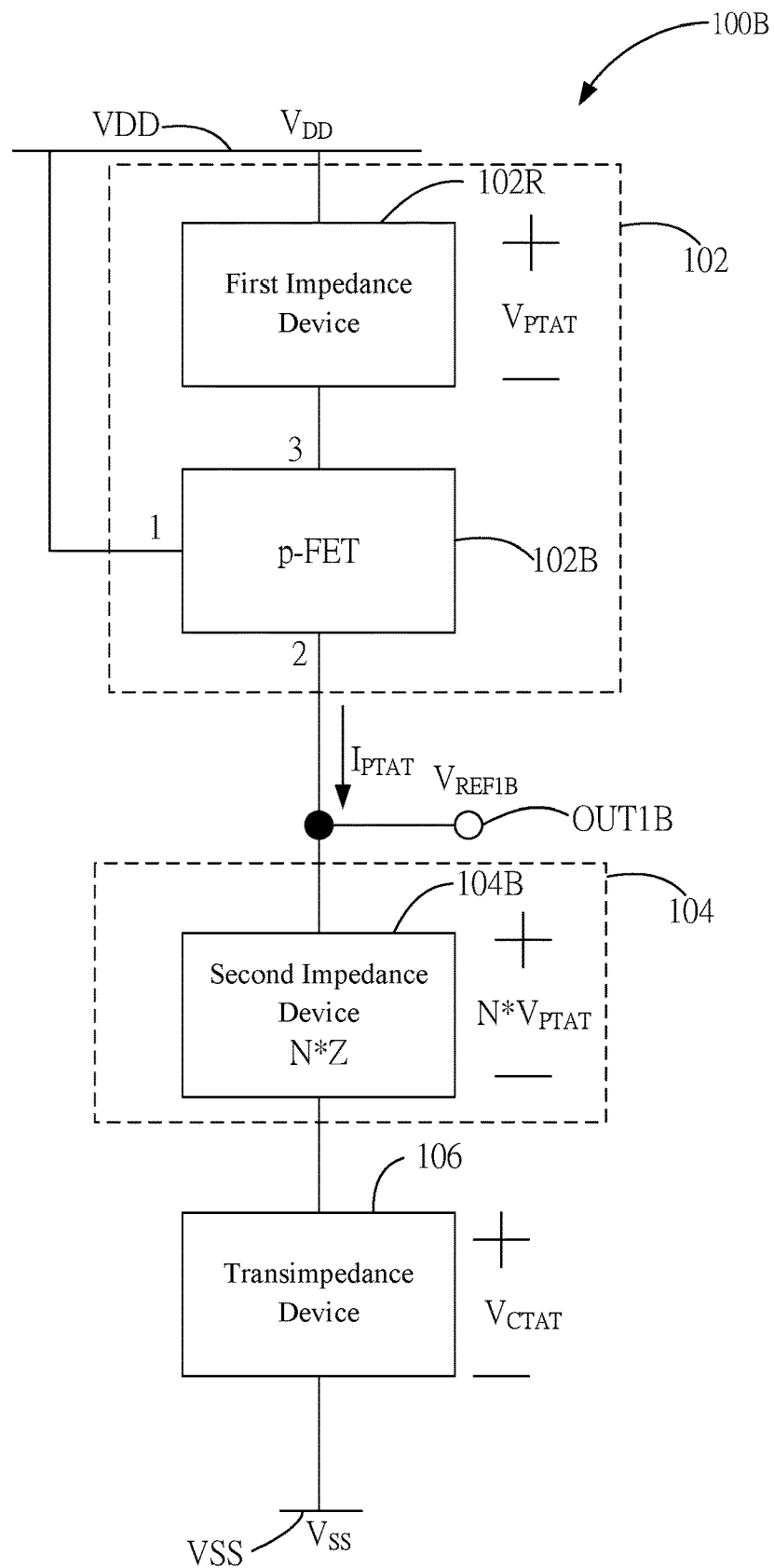
FIG. 5 shows a schematic diagram of the reference voltage circuit according to another embodiment of FIG. 3.

As shown in FIG. 5, which shows a schematic diagram of the reference voltage circuit according to another embodiment of FIG. 3. As shown in the figure, the reference voltage circuit 100B according to the present embodiment is the detailed circuit of the reference voltage circuit 100 of the first embodiment. The current source 102 according to the present embodiment includes a p-FET 102B and a first impedance device 102R. A second impedance device 104B is disposed between the current source 102 and the transimpedance 106. The first terminal of the p-FET 102B is coupled to the first voltage terminal VDD for receiving the first voltage $V_{DD}$ and providing a positive threshold voltage to the p-FET 102B. The second terminal of the p-FET 102B is coupled to the second impedance device 104B. The first impedance device 102R is coupled between the third terminal of the p-FET 102B and the first voltage terminal VDD. Thereby, the second terminal of the p-FET 102B provides the positive temperature coefficient current $I_{PTAT}$ to the second impedance device 104B. According to the present embodiment, the impedance of the second impedance device 104B is multiple times of the impedance of the first impedance device 102R. For example, the impedance (N*Z) of the second impedance device 104B is N times of the impedance (Z) of the first impedance device 102R. Thereby, the positive temperature coefficient voltage $N*V_{PTAT}$ generated by the second impedance device 104B is N times of the positive temperature coefficient voltage $V_{PTAT}$ generated by the first impedance device 102R. In other words, the positive temperature coefficient voltage generated by the first impedance device 102R is $V_{PTAT}$ while the positive temperature coefficient voltage generated by the second impedance device 104B is $N*V_{PTAT}$. Besides, like the previous embodiment, the transimpedance device 106 generates the negative temperature coefficient voltage $V_{CTAT}$. Namely, the reference voltage $V_{REF1B}$ according to the present embodiment is different from the reference voltage $V_{REF1A}$ according to the previous embodiment, as shown in equation (4) below:

$$V_{REF1B} = V_{SS} + V_{CTAT} + N \times V_{PTAT} \quad (4)$$

According to the second and third embodiments as described above, it is known that the connections for n-FET 102A and p-FET 102B are different. However, they both can generate the positive temperature coefficient current $I_{PTAT}$ to the corresponding impedance devices for generating the corresponding positive temperature coefficient voltages.

Figure 6A:
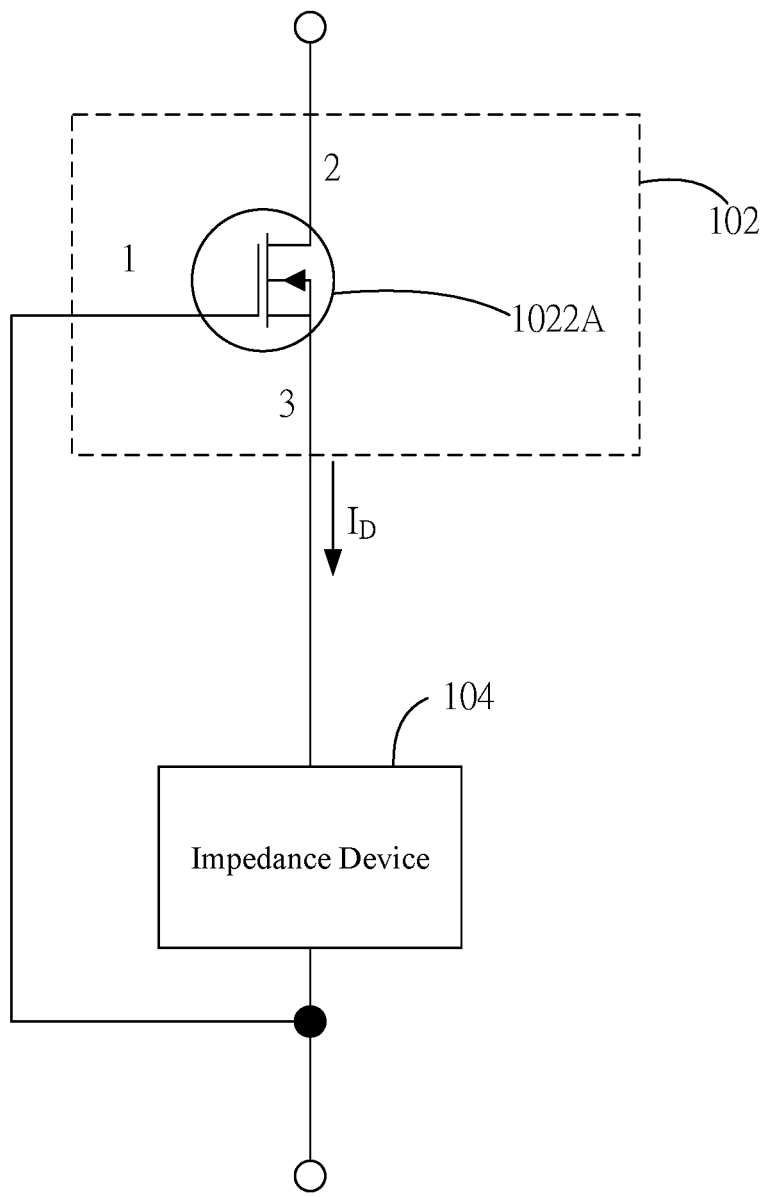
FIG. 6A shows a schematic diagram of the circuit of a depletion-mode n-MOSFET and an impedance device according to the present application.
Figure 6B:
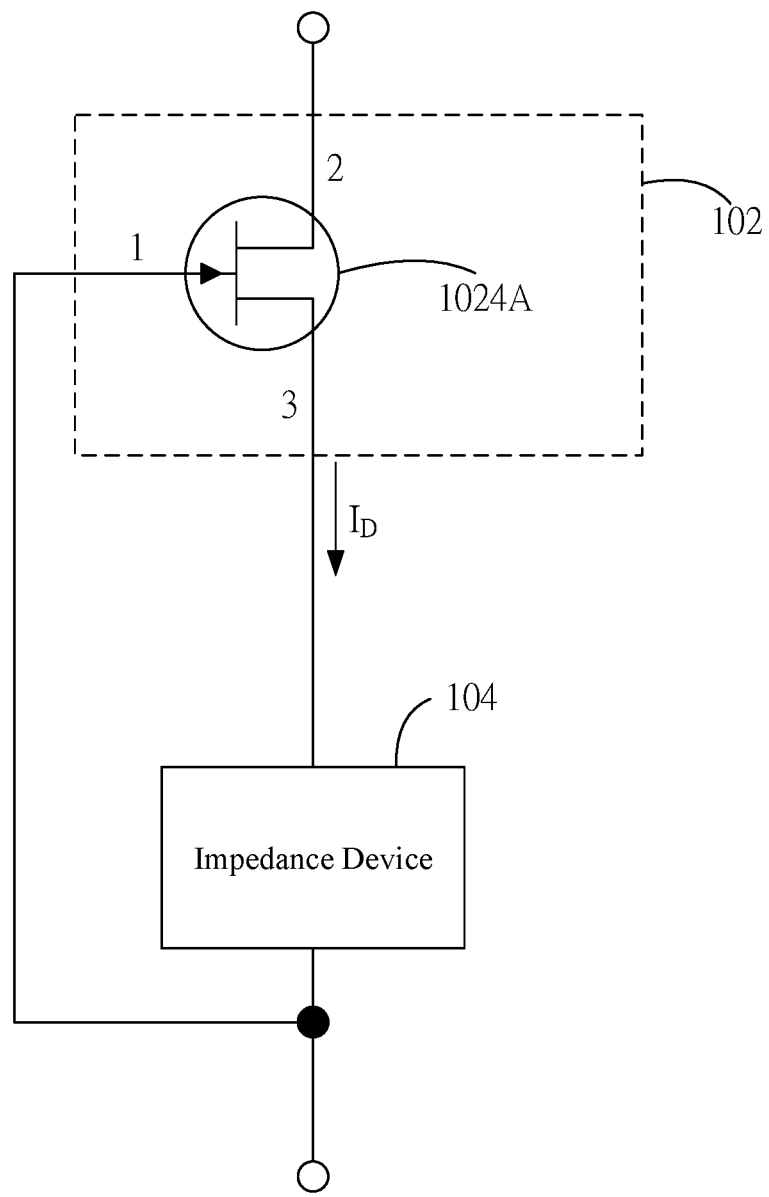
FIG. 6B shows a schematic diagram of the circuit of an n-JFET and an impedance device according to the present application.
Figure 6C:
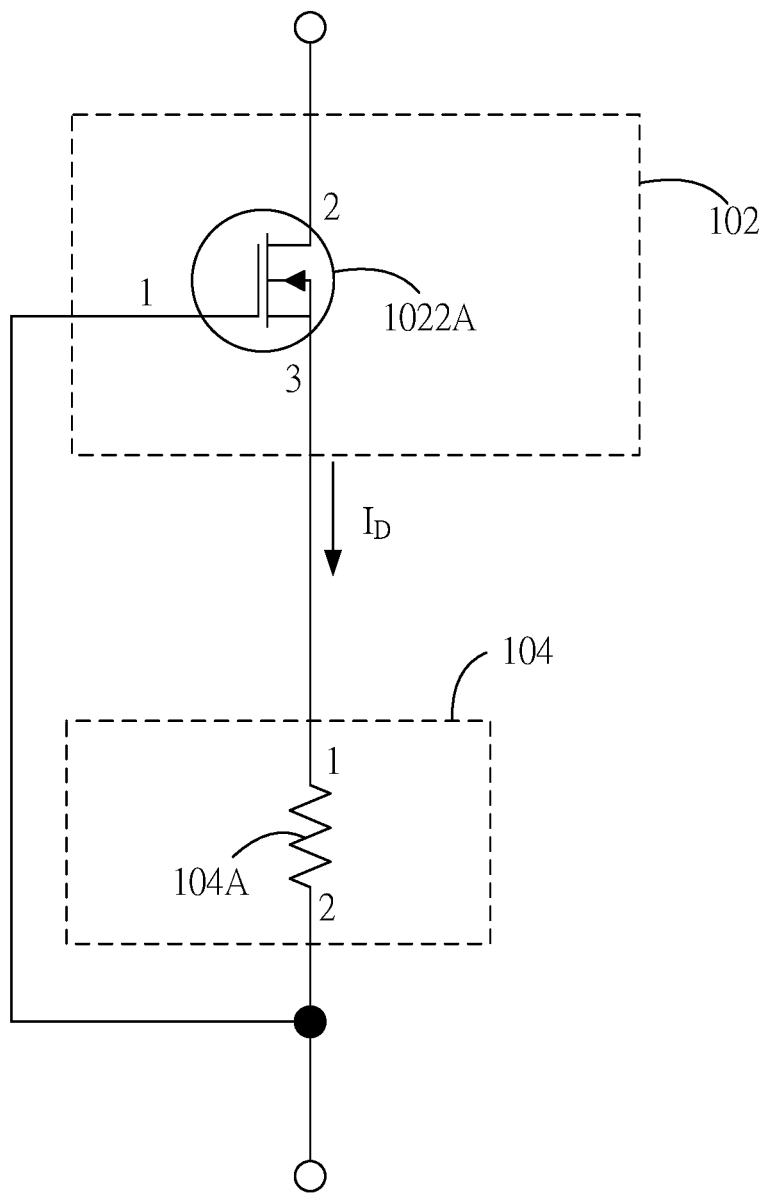
FIG. 6C shows a schematic diagram of the circuit of a depletion-mode n-MOSFET and a resistor according to the present application.
Figure 7:
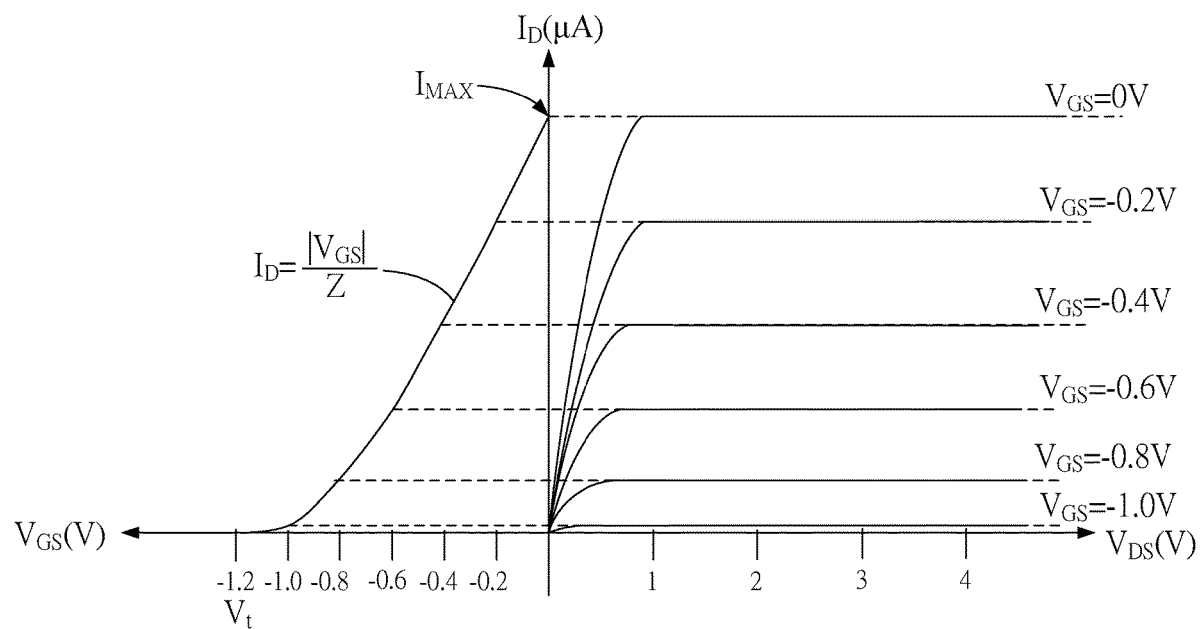
FIG. 7 shows signal curves of a depletion-mode n-MOSFET according to the present application.

As shown in FIGS. 6A, 6B, and 6C, the n-FET 102A as described above can further be a depletion-mode n-type metal-oxide-semiconductor field-effect transistor (D-mode n-MOSFET) 1022A or an n-type junction field-effect transistor (n-JFET) 1024A operating in the saturation region for providing the saturation current $I_D$ to the impedance device 104. As shown in FIG. 6A, the D-mode n-MOSFET 1022A is coupled to the impedance device 104. As shown in FIG. 6B, the n-JFET 1024A is coupled to the impedance device 104. As shown in FIG. 6C, the impedance device 104 can further be a resistor 104A with both terminals coupled to the first and third terminals of the D-mode n-MOSFET 1022A, respectively. Furthermore, please refer to FIG. 6C and FIG. 7. Because the saturation current $I_D$ is proportional to the absolute value of the gate-to-source voltage $V_{GS}$ of the D-mode n-MOSFET 1022A and inversely proportional to the impedance Z of the impedance device 104, the saturation current $I_D$ varies linearly with the gate-to-source voltage $V_{GS}$. In other words, the increase or decrease of the gate-to-source voltage $V_{GS}$ will increase or decrease the saturation current $I_D$. In addition, when the gate-to-source voltage $V_{GS}$ is zero, the saturation current $I_{MAX}$ is maximum. At this moment, the D-mode n-MOSFET 1022A is operated in the sub-threshold region. The relation between the saturation current $I_D$ and the gate-to-source voltage $V_{GS}$ is expressed as equation (5). It is known that the gate-to-source voltage $V_{GS}$ is a multiple of the threshold voltage $V_t$.

$$V_{GS} = \left(1 - \sqrt{\frac{I_D}{I_{Max}}}\right) \times V_t = \alpha \times V_t \quad (5)$$

Figure 8A:
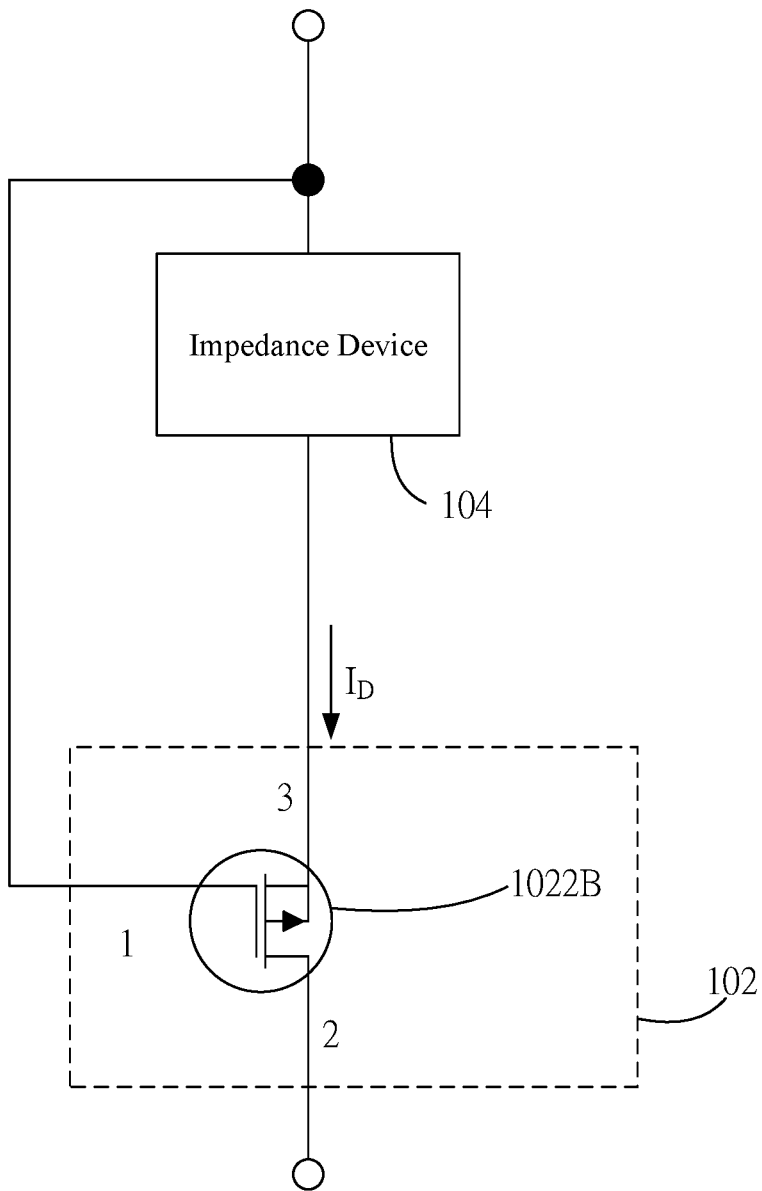
FIG. 8A shows a schematic diagram of the circuit of a depletion-mode p-MOSFET and an impedance device according to the present application.
Figure 8B:
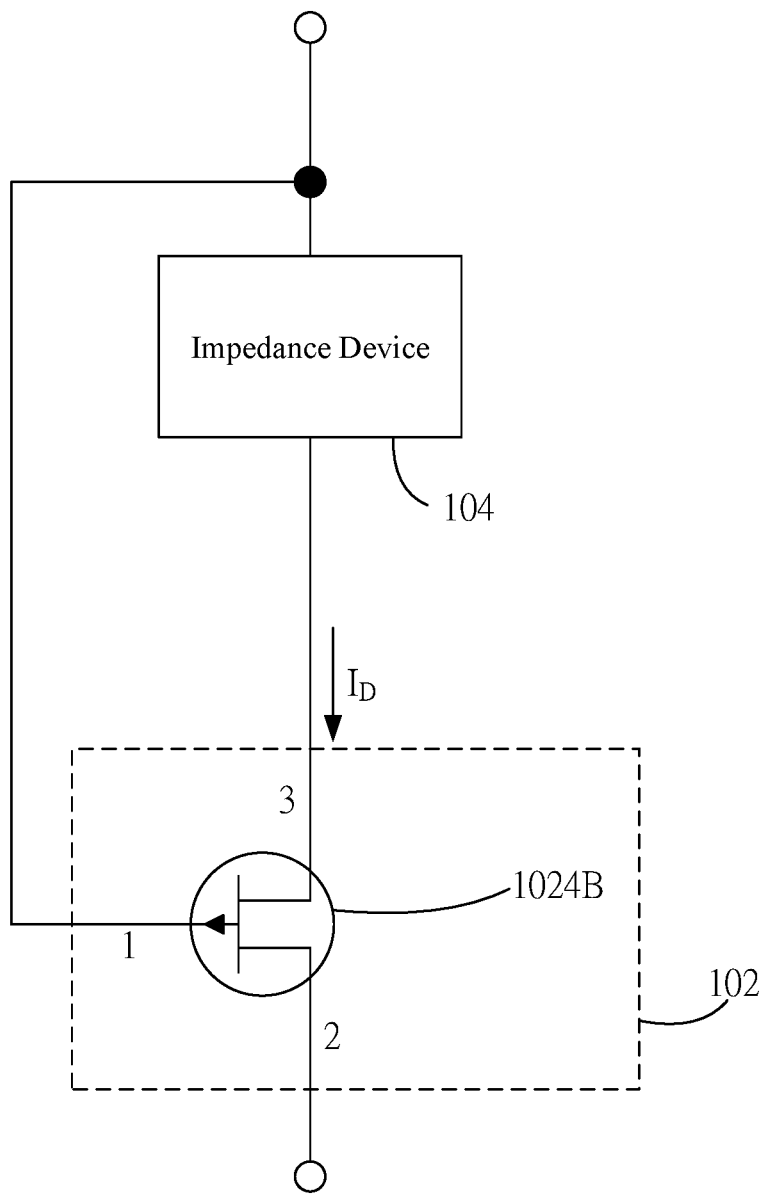
FIG. 8B shows a schematic diagram of the circuit of a p-JFET and an impedance device according to the present application.
Figure 8C:
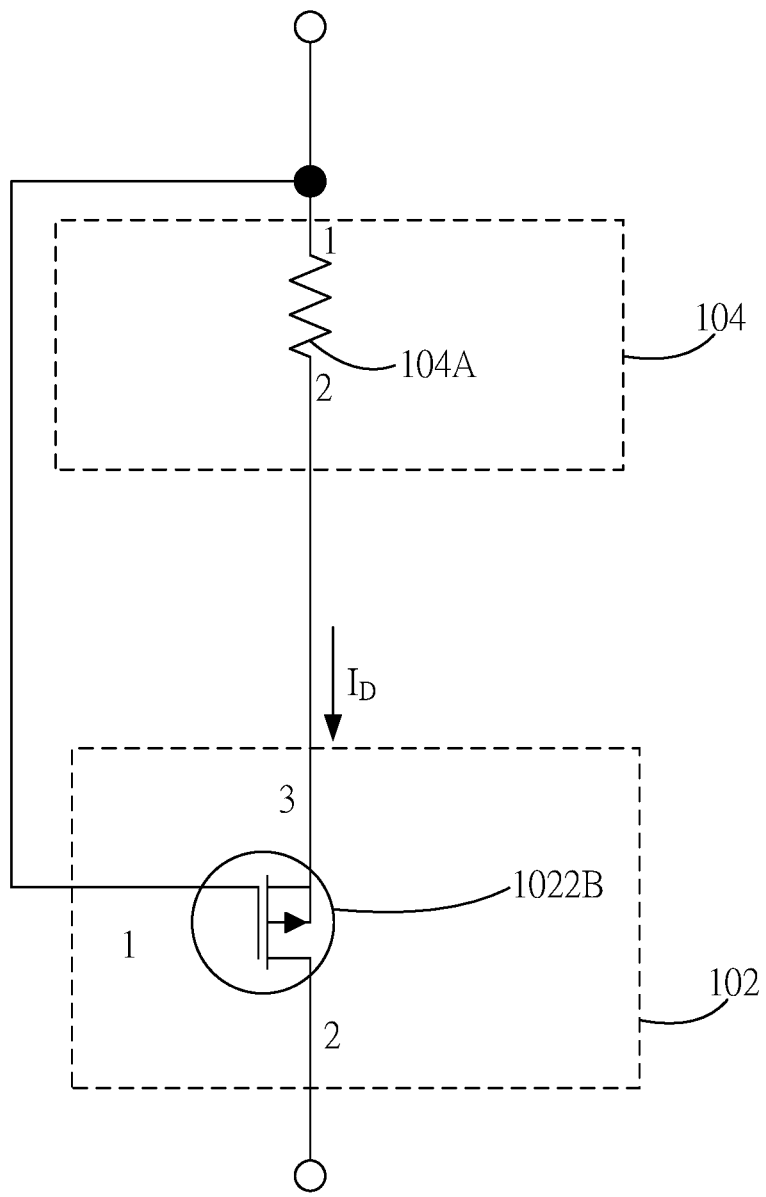
FIG. 8C shows a schematic diagram of the circuit of a depletion-mode p-MOSFET and a resistor according to the present application.
Figure 9:
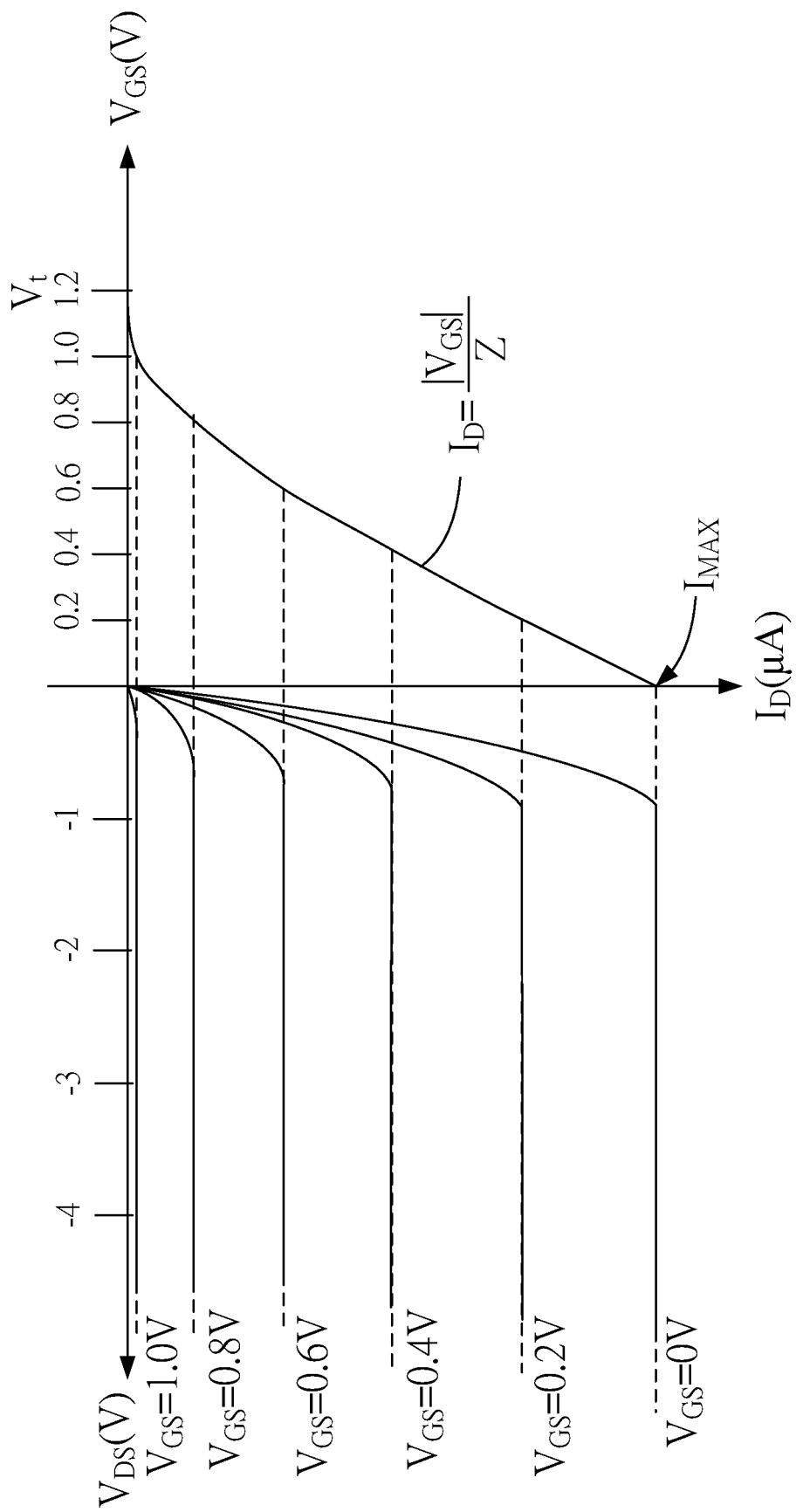
FIG. 9 shows signal curves of a depletion-mode p-MOSFET according to the present application.
Figure 10A:
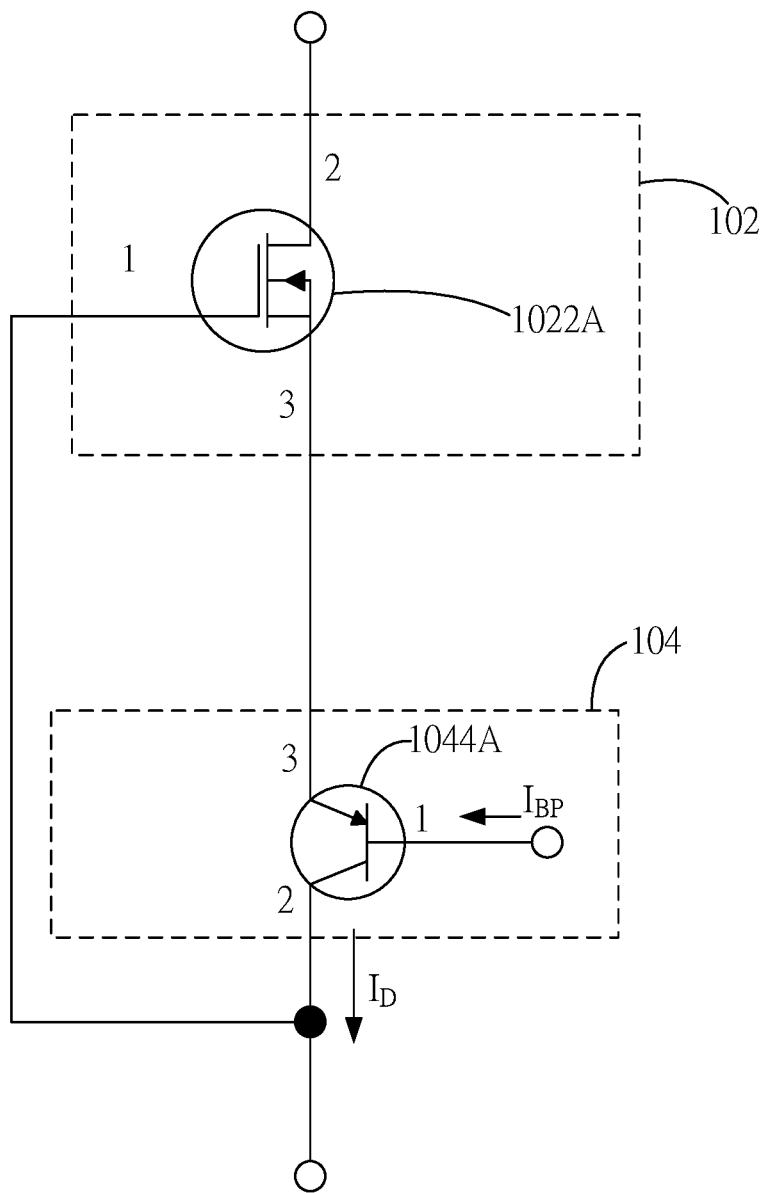
FIG. 10A shows a schematic diagram of the circuit of a depletion-mode n-MOSFET and a PNP BJT according to the present application.
Figure 10B:
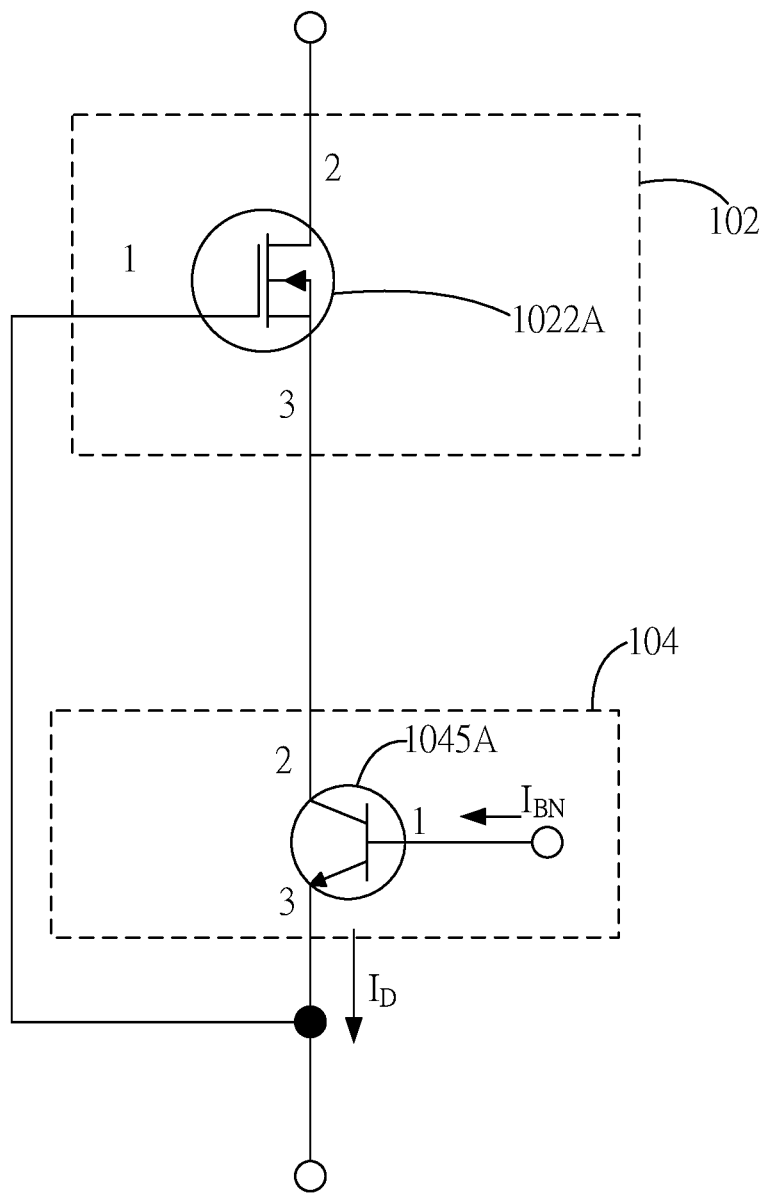
FIG. 10B shows a schematic diagram of the circuit of a depletion-mode n-MOSFET and an NPN BJT according to the present application.
Figure 10C:
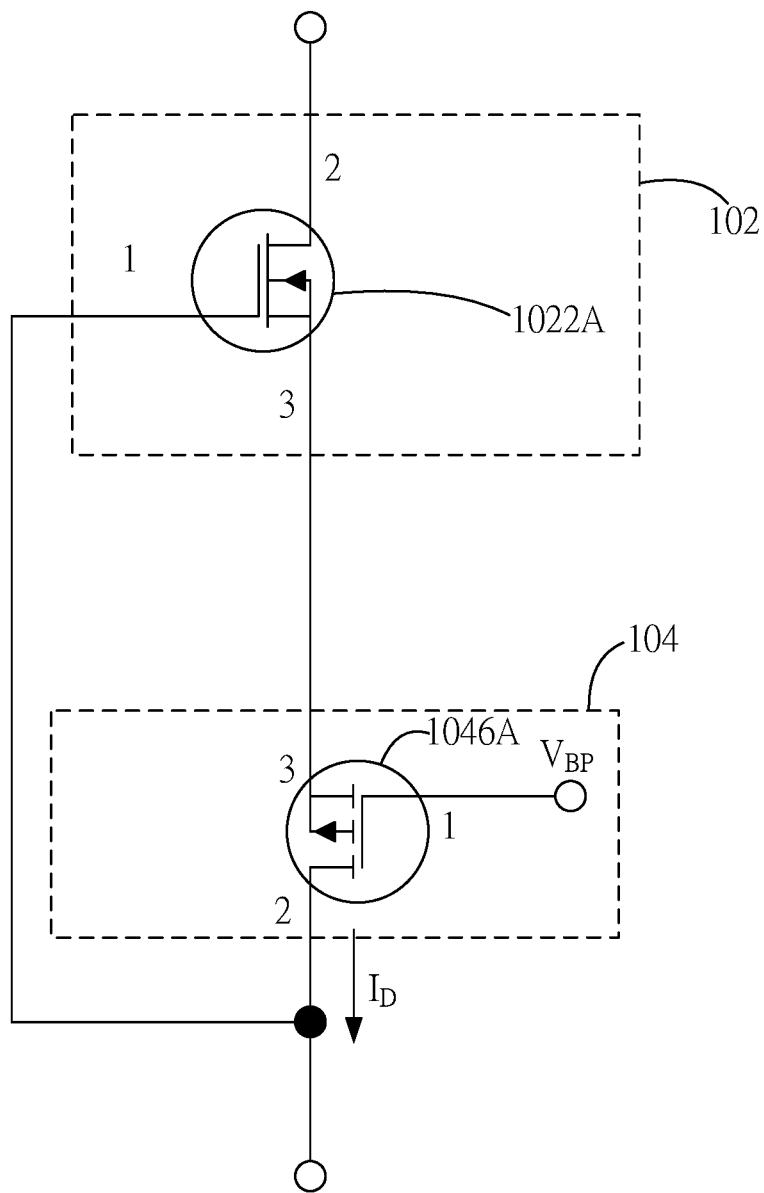
FIG. 10C shows a schematic diagram of the circuit of a depletion-mode n-MOSFET and an enhancement-mode p-MOSFET according to the present application.
Figure 10D:
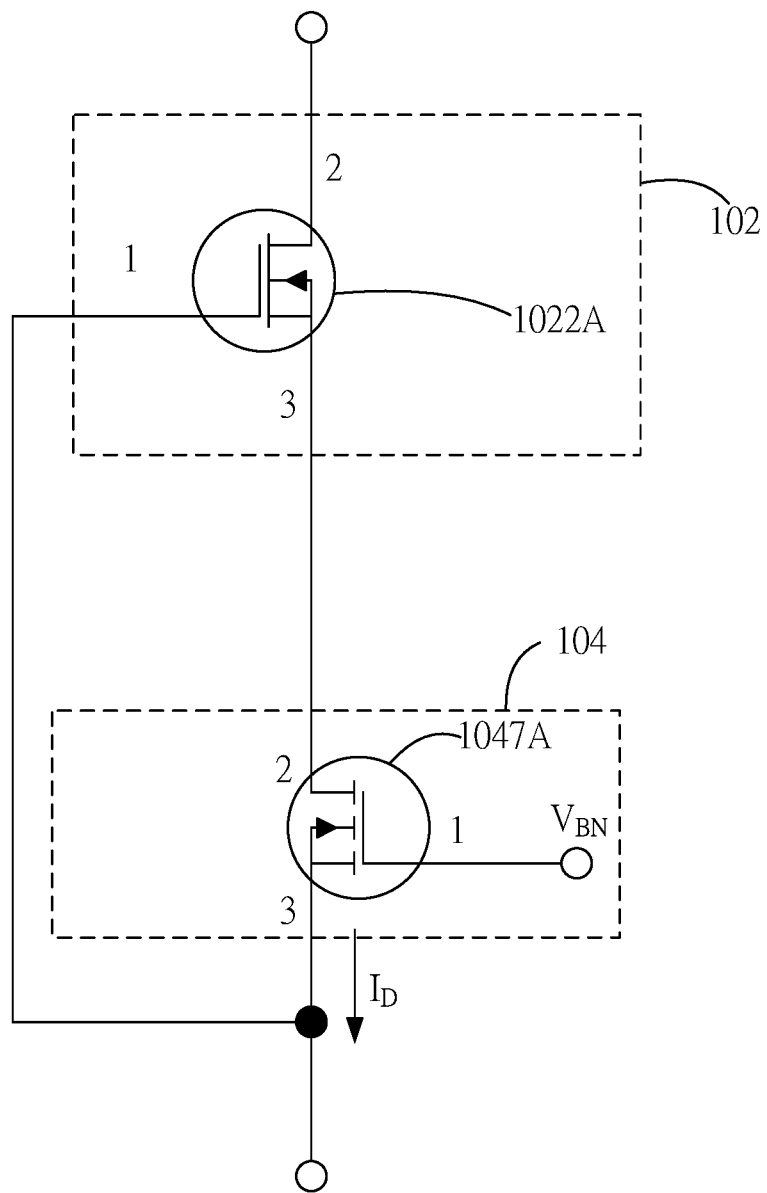
FIG. 10D shows a schematic diagram of the circuit of a depletion-mode n-MOSFET and an enhancement-mode n-MOSFET according to the present application.

As shown in FIGS. 8A, 8B, and 8C, the p-FET 102B as described above can further be a depletion-mode p-type metal-oxide-semiconductor field-effect transistor (D-mode p-MOSFET) 1022B or a p-type junction field-effect transistor (p-JFET) 1024B operating in the saturation region for providing the saturation current $I_D$ to the impedance device 104. As shown in FIG. 8A, the D-mode p-MOSFET 1022B is coupled to the impedance device 104. As shown in FIG. 8B, the p-JFET 1024B is coupled to the impedance device 104. As shown in FIG. 8C, the impedance device 104 can further be a resistor 104A. Furthermore, please refer to FIG. 8A and FIG. 9. Because the saturation current $I_D$ is proportional to the gate-to-source voltage $V_{GS}$ of the D-mode p-MOSFET 1022B and inversely proportional to the impedance Z of the impedance device 104, the saturation current $I_{MAX}$ is maximum when the gate-to-source voltage $V_{GS}$ is zero and acts as the p-type positive temperature coefficient current $I_{PTAT\_P}$. The relation between the saturation current $I_D$ and the gate-to-source voltage $V_{GS}$ is expressed as equation (5) above.

As shown in FIGS. 10A to 10D, the embodiment of the impedance device 104 accompanying the D-mode n-MOSFET 1022A can further be a PNP bipolar junction transistor (PNP BJT) 1044A, an NPN bipolar junction transistor (NPN BJT) 1045A, an enhancement-mode (E-mode) p-MOSFET 1046A, or an E-mode n-MOSFET 1047A. A first terminal of the PNP BJT 1044A is coupled to an input current $I_{BP}$. A second terminal of the PNP BJT 1044A is coupled to the first terminal of the D-mode n-MOSFET 1022A. A third terminal of the PNP BJT 1044A is coupled to the third terminal of the D-mode n-MOSFET 1022A. A first terminal of the NPN BJT 1045A is coupled to an input current IBN. A second terminal of the NPN BJT 1045A is coupled to the third terminal of the D-mode n-MOSFET 1022A. A third terminal of the NPN BJT 1045A is coupled to the first terminal of the D-mode n-MOSFET 1022A.

A first terminal of the E-mode p-MOSFET 1046A is coupled to an input voltage $V_{BP}$. A second terminal of the E-mode p-MOSFET 1046A is coupled to the first terminal of D-mode n-MOSFET 1022A. A third terminal of the E-mode p-MOSFET 1046A is coupled to the third terminal of D-mode n-MOSFET 1022A. A first terminal of the E-mode n-MOSFET 1047A is coupled to an input voltage $V_{BN}$. A second terminal of the E-mode n-MOSFET 1047A is coupled to the third terminal of the D-mode n-MOSFET 1022A. A third terminal of the E-mode n-MOSFET 1047A is coupled to the first terminal of the D-mode n-MOSFET 1022A.

Figure 11:
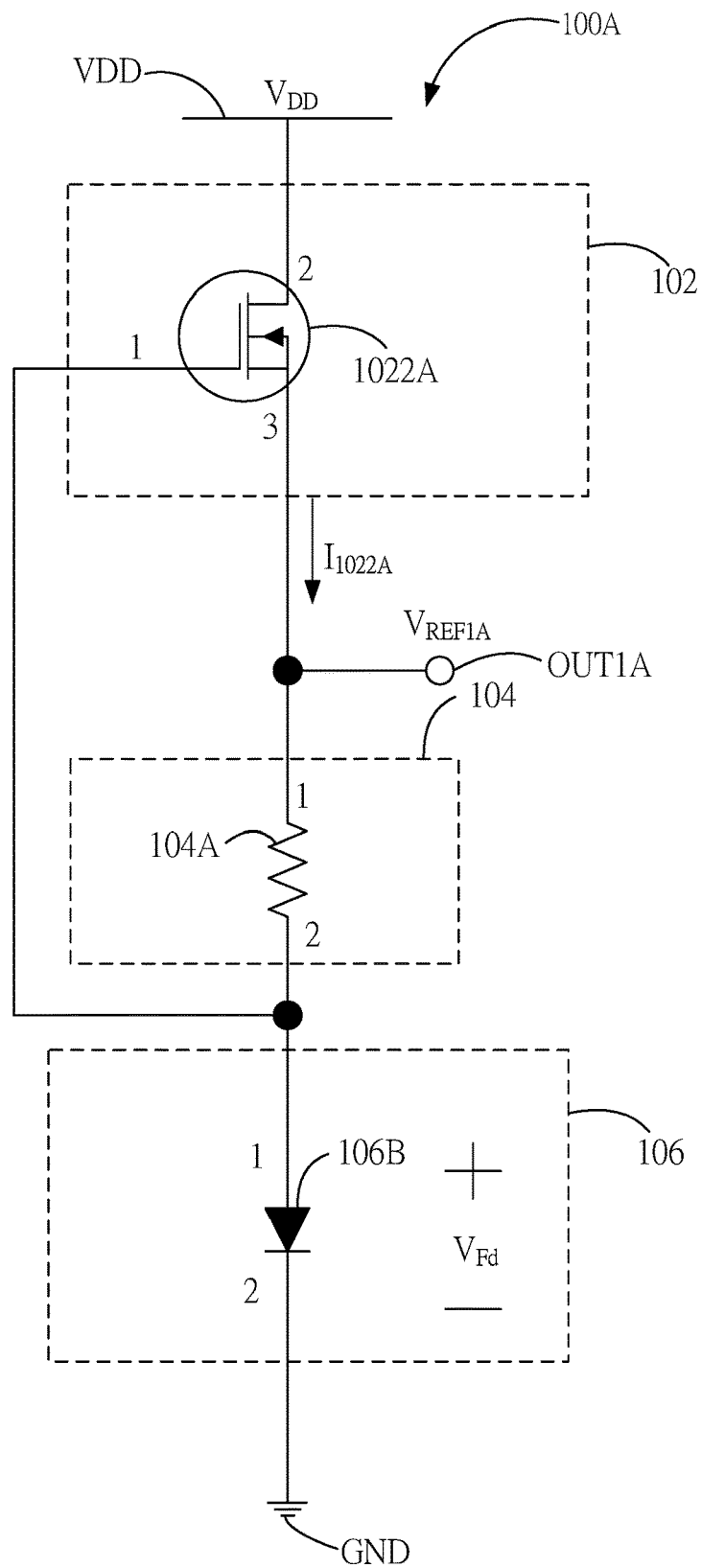
FIG. 11 shows a schematic diagram of the reference voltage circuit according to another embodiment of FIG. 4.

As shown in FIG. 11, which shows a schematic diagram of the reference voltage circuit according to another embodiment of FIG. 4. The current source 102 according to the present embodiment is the D-mode n-MOSFET 1022A. The impedance device 104 according to the present embodiment is the resistor 104A. The transimpedance device 106 according to the present embodiment is a diode 106B. The first terminal of the D-mode n-MOSFET 1022A is coupled to the second terminal of the resistor 104A and a first terminal of the diode 106B. The second terminal of the D-mode n-MOSFET 1022A is coupled to the first voltage terminal VDD for receiving the first voltage $V_{DD}$. The third terminal of the D-mode n-MOSFET 1022A is coupled to the first terminal of the resistor 104A and the output terminal OUT1A. A second terminal of the diode 106B is coupled to the ground GND. Please refer to equation (5) above. The current $I_{1022A}$ of the D-mode n-MOSFET 1022A and the resistance $R_{104A}$ of the resistor 104A are used to provide the corresponding source-to-gate voltage $V_{SG}$. The diode 106B provides a forward bias $V_{Fd}$. The source-to-gate voltage $V_{SG}$ and the forward bias $V_{Fd}$ are used to produce a reference voltage $V_{REF1A}$ with a temperature coefficient close to zero. Thereby, the relations between the source-to-gate voltage $V_{SG}$, the forward bias $V_{Fd}$, and the reference voltage $V_{REF1A}$ at the output terminal OUT1A are expressed in equations (6) to (9):

$$V_{REF1A} = V_{Fd} + (I_{1022A} \times R_{104A}) \tag{6}$$

$$V_{REF1A} = V_{Fd} + (-V_{GS1022A}) \tag{7}$$

$$V_{REF1A} = V_{Fd} + (-\alpha \times V_{t1022A}) \tag{8}$$

$$\text{Let } \frac{\partial}{\partial T} V_{Fd} = \alpha \frac{\partial}{\partial T} V_{t1022A} \rightarrow \frac{\partial}{\partial T} V_{REF1A} = 0 \tag{9}$$

Figure 12:
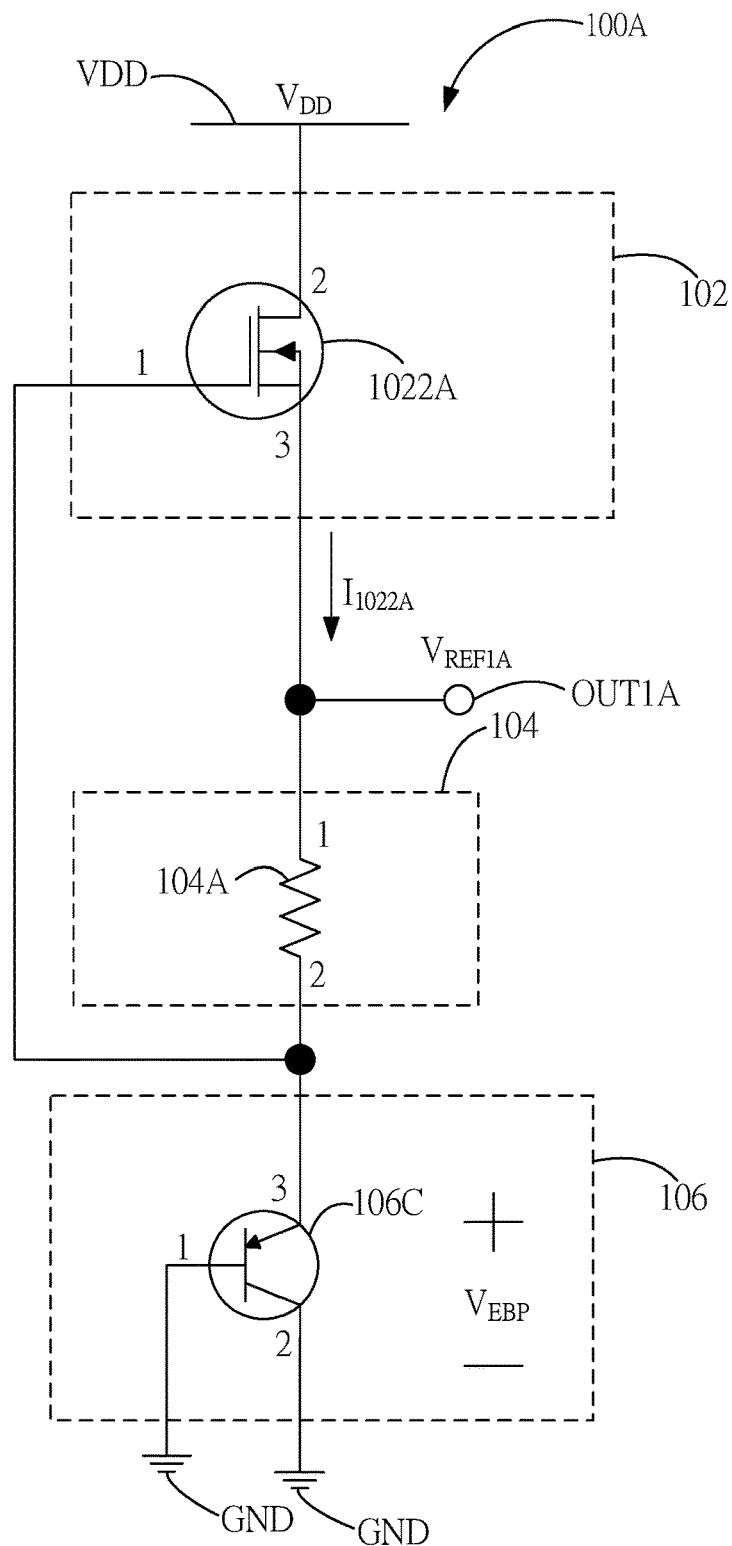
FIG. 12 shows a schematic diagram of the reference voltage circuit according to another embodiment of FIG. 4.

As shown in FIG. 12, which shows a schematic diagram of the reference voltage circuit according to another embodiment of FIG. 4. The difference between the present embodiment and the previous one is that the transimpedance device 106 is changed to a PNP BJT 106C. The first terminal of the D-mode n-MOSFET 1022A is coupled to the second terminal of the resistor 104A and a second terminal of the PNP BJT 106C. The second terminal of the D-mode n-MOSFET 1022A is coupled to the first voltage terminal VDD for receiving the first voltage $V_{DD}$. The third terminal of the D-mode n-MOSFET 1022A is coupled to the first terminal of the resistor 104A and the output terminal OUT1A. A first terminal and a third terminal of the PNP BJT 106C is coupled to the ground GND. Please refer to equation (5) above. The current $I_{1022A}$ of the D-mode n-MOSFET 1022A and the resistance $R_{104A}$ of the resistor 104A are used to provide the corresponding source-to-gate voltage $V_{SG}$. The PNP BJT 106C provides a reverse bias $V_{EBP}$ of PNP. The relations between the source-to-gate voltage $V_{SG}$, the reverse bias $V_{EBP}$, and the reference voltage $V_{REF1A}$ at the output terminal OUT1A are expressed in equations (10) to (13):

$$V_{REF1A} = V_{EBP} = +(I_{1022A} \times R_{104A}) \tag{10}$$

$$V_{REF1A} = V_{EBP} + (-V_{GS1022A}) \tag{11}$$

$$V_{REF1A} = V_{EBP} + (-\alpha \times V_{t1022A}) \tag{12}$$

$$\text{Let } \frac{\partial}{\partial T} V_{EBP} = \alpha \frac{\partial}{\partial T} V_{t1022A} \rightarrow \frac{\partial}{\partial T} V_{REF1A} = 0 \tag{13}$$

Figure 13:
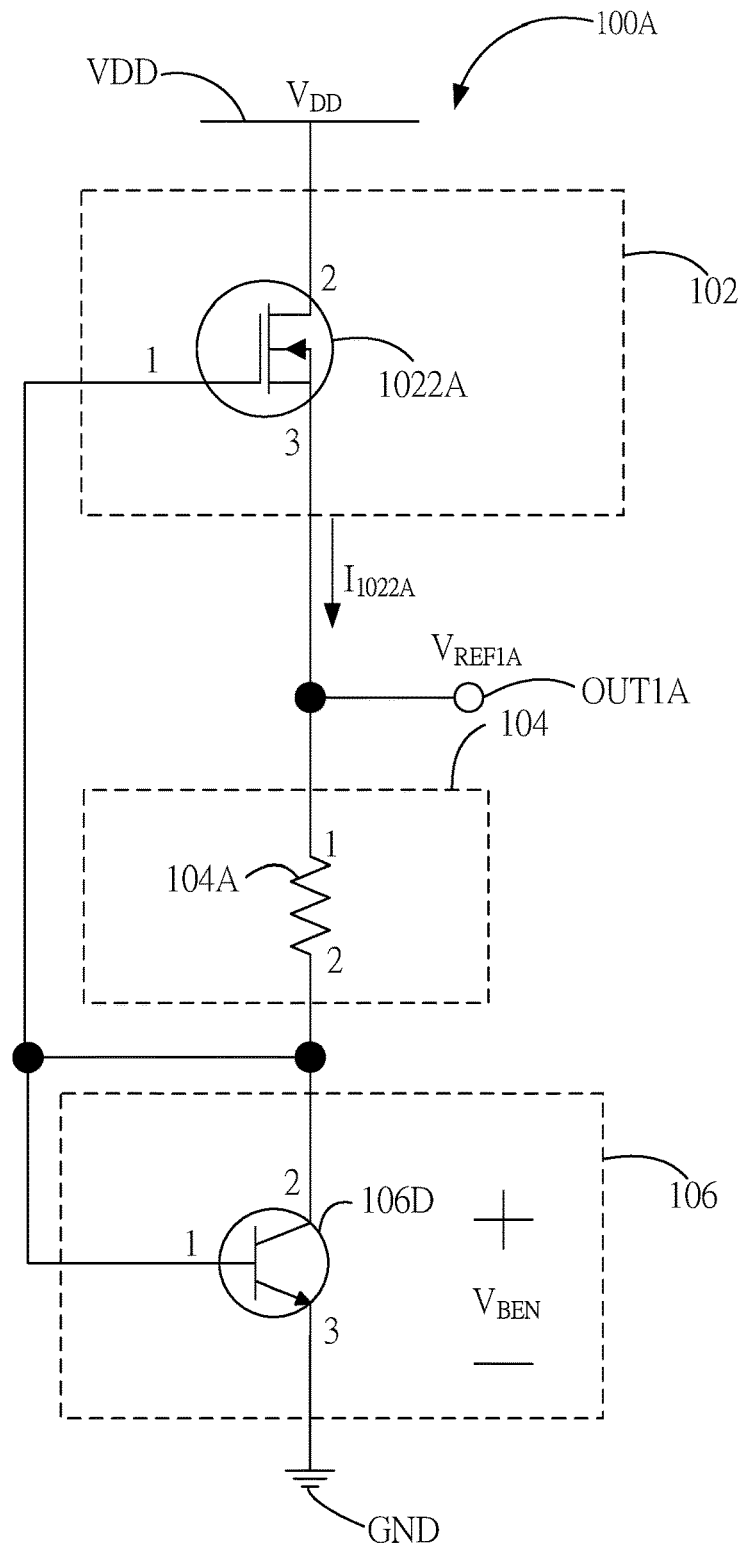
FIG. 13 shows a schematic diagram of the reference voltage circuit according to another embodiment of FIG. 4.

As shown in FIG. 13, which shows a schematic diagram of the reference voltage circuit according to another embodiment of FIG. 4. The difference between the present embodiment and the previous one is that the transimpedance device 106 is changed to an NPN BJT 106D. The first terminal of the D-mode n-MOSFET 1022A is coupled to the second terminal of the resistor 104A and a first and a second terminal of the NPN BJT 106D. The second terminal of the D-mode n-MOSFET 1022A is coupled to the first voltage terminal VDD for receiving the first voltage $V_{DD}$. The third terminal of the D-mode n-MOSFET 1022A is coupled to the first terminal of the resistor 104A and the output terminal OUT1A. A third terminal of the NPN BJT 106D is coupled to the ground GND. Please refer to equation (5) above. The current $I_{1022A}$ of the D-mode n-MOSFET 1022A and the resistance $R_{104A}$ of the resistor 104A are used to provide the corresponding source-to-gate voltage $V_{SG}$. The NPN BJT 106D provides a forward bias $V_{BEN}$ of NPN. The relations between the source-to-gate voltage $V_{SG}$, the forward bias $V_{BEN}$, and the reference voltage $V_{REF1A}$ at the output terminal OUT1A are expressed in equations (14) to (17):

$$V_{REF1A} = V_{BEN} + (I_{1022A} \times R_{104A}) \tag{14}$$

$$V_{REF1A} = V_{BEN} + (-V_{GS1022A}) \tag{15}$$

$$V_{REF1A} = V_{BEN} + (-\alpha \times V_{t1022A}) \tag{16}$$

$$\text{Let } \frac{\partial}{\partial T} V_{BEN} = \alpha \frac{\partial}{\partial T} V_{t1022A} \rightarrow \frac{\partial}{\partial T} V_{REF1A} = 0 \tag{17}$$

Figure 14:
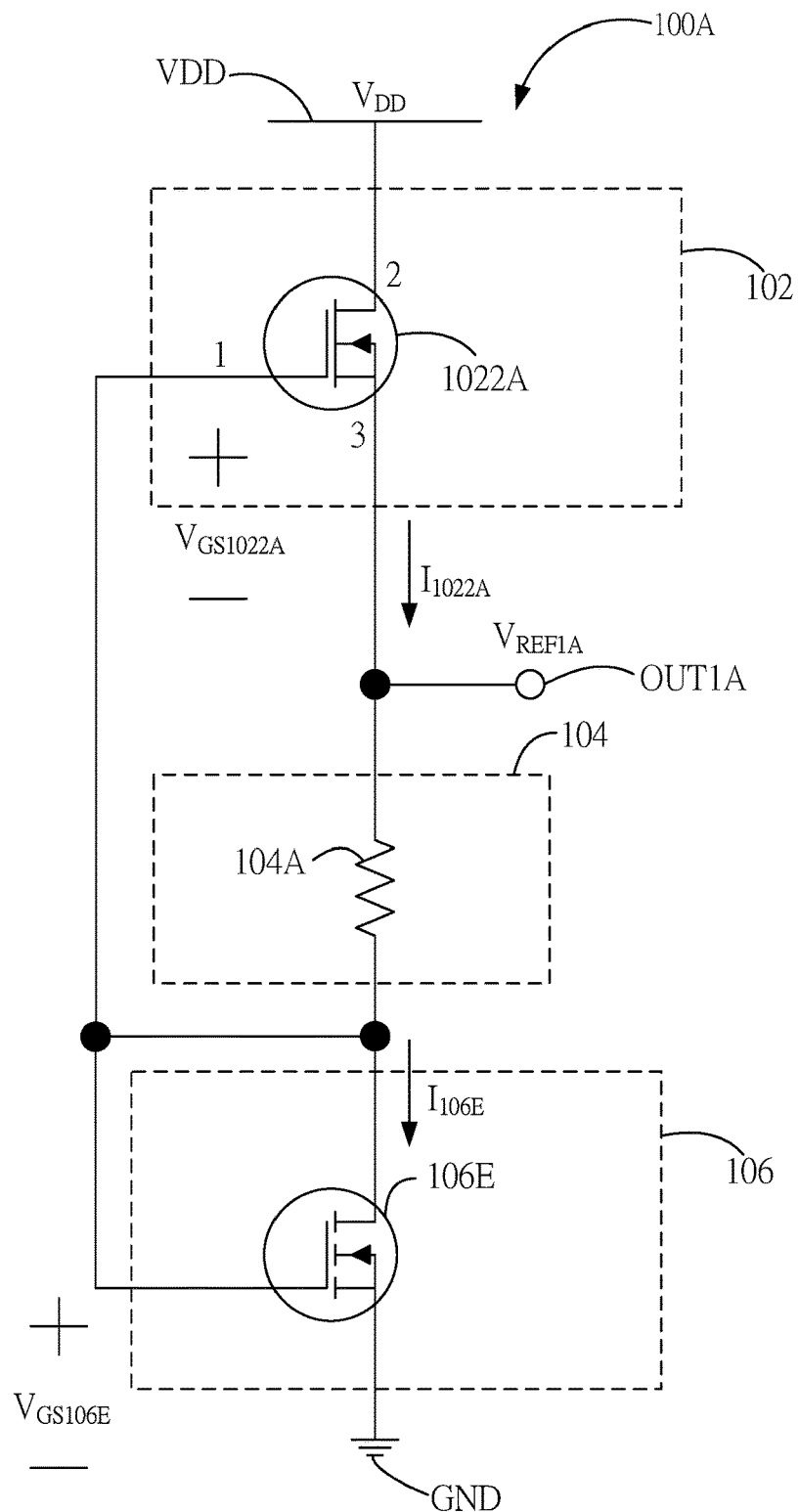
FIG. 14 shows a schematic diagram of the reference voltage circuit according to another embodiment of FIG. 4.

As shown in FIG. 14, which shows a schematic diagram of the reference voltage circuit according to another embodiment of FIG. 4. The difference between the present embodiment and the previous one is that the transimpedance device 106 is changed to an E-mode n-MOSFET 106E. Equivalently, the current source 102 provides a first transistor and the transimpedance device 106 provides a second transistor. The first terminal of the D-mode n-MOSFET 1022A is coupled to the second terminal of the resistor 104A and a first and a second terminal of the E-mode n-MOSFET 106E. The second terminal of the D-mode n-MOSFET 1022A is coupled to the first voltage terminal VDD for receiving the first voltage $V_{DD}$. The third terminal of the D-mode n-MOSFET 1022A is coupled to the first terminal of the resistor 104A and the output terminal OUT1A. A third terminal of the E-mode n-MOSFET 106E is coupled to the ground GND. Please refer to equation (5) above. The current $I_{1022A}$ of the D-mode n-MOSFET 1022A and the resistance $R_{104A}$ of the resistor 104A are used to provide the corresponding gate-to-source voltage $V_{GS1022A}$. The E-mode n-MOSFET 106E provides a gate-to-source bias $V_{GS106E}$. The relations between the source-to-gate voltage $V_{SG}$ of the D-mode n-MOSFET 1022A, the gate-to-source voltage $V_{GS}$ of the E-mode n-MOSFET 106E, and the reference voltage $V_{REF1A}$ at the output terminal OUT1A, and the corresponding $I_{1022A}$ of the D-mode n-MOSFET 1022A and $I_{106E}$ of the E-mode n-MOSFET 106E, are expressed in equations (18) to (19):

$$I_{1022A} = \tag{18}$$

$$\frac{1}{2}\mu_{n1}C_{ox1}\left(\frac{W}{L}\right)_1(V_{GS1022A} - V_{t1022A})^2 = \beta_{1022A}(V_{GS1022A} - V_{t1022A})^2$$

$$I_{106E} = \frac{1}{2}\mu_{n2}C_{ox2}\left(\frac{W}{L}\right)_2(V_{GS106E} - V_{t106E})^2 = \beta_{106E}(V_{GS106E} - V_{t106E})^2 \tag{19}$$

Let $I_{1022A} = I_{106E}$, $\beta_1(V_{GS1022A} - V_{t1022A})^2 = \beta_2(V_{GS106E} - V_{t106E})^2$ (20)

$$\sqrt{\frac{\beta_2}{\beta_1}} = \frac{V_{GS1022A} - V_{t1022A}}{V_{GS106E} - V_{t106E}} = K \tag{21}$$

The relation of the gate-to-source voltage $V_{gs1022A}$ between the first and third terminal of the D-mode n-MOSFET 1022A and the gate-to-source voltage $V_{gs106E}$ between the first and third terminal of the E-mode n-MOSFET 106E is expressed in equation (22):

$$V_{GS1022A} - V_{t1022A} = K(V_{GS106E} - V_{t106E}) \tag{22}$$

$$\alpha V_{t1022A} - V_{t1022A} = K(V_{REF1A} - V_{SG1022A} - V_{t106E}) \tag{23}$$

$$= K(V_{REF1A} - V_{SG1022A} - V_{t106E})$$

$$= K(V_{REF1A} + \alpha V_{t1022A} - V_{t106E})$$

$$V_{REF1A} = V_{t106E} - \left(\frac{1+\alpha}{K} + \alpha\right)V_{t1022A} \tag{24}$$

Let $\frac{\partial}{\partial T}V_{t106E} = \left(\frac{1+\alpha}{K} + \alpha\right)\frac{\partial}{\partial T}V_{t1022A} \rightarrow \frac{\partial}{\partial T}V_{REF1A} = 0$ (25)

According to equations (23) to (25), it is known that by using the gate-to-source voltage $V_{gs1022A}$ between the first and third terminal of the D-mode n-MOSFET 1022A and the gate-to-source voltage $V_{gs106E}$ between the first and third terminal of the E-mode n-MOSFET 106E, the temperature coefficient of the reference voltage $V_{REF1A}$ can approach zero.

Figure 15:
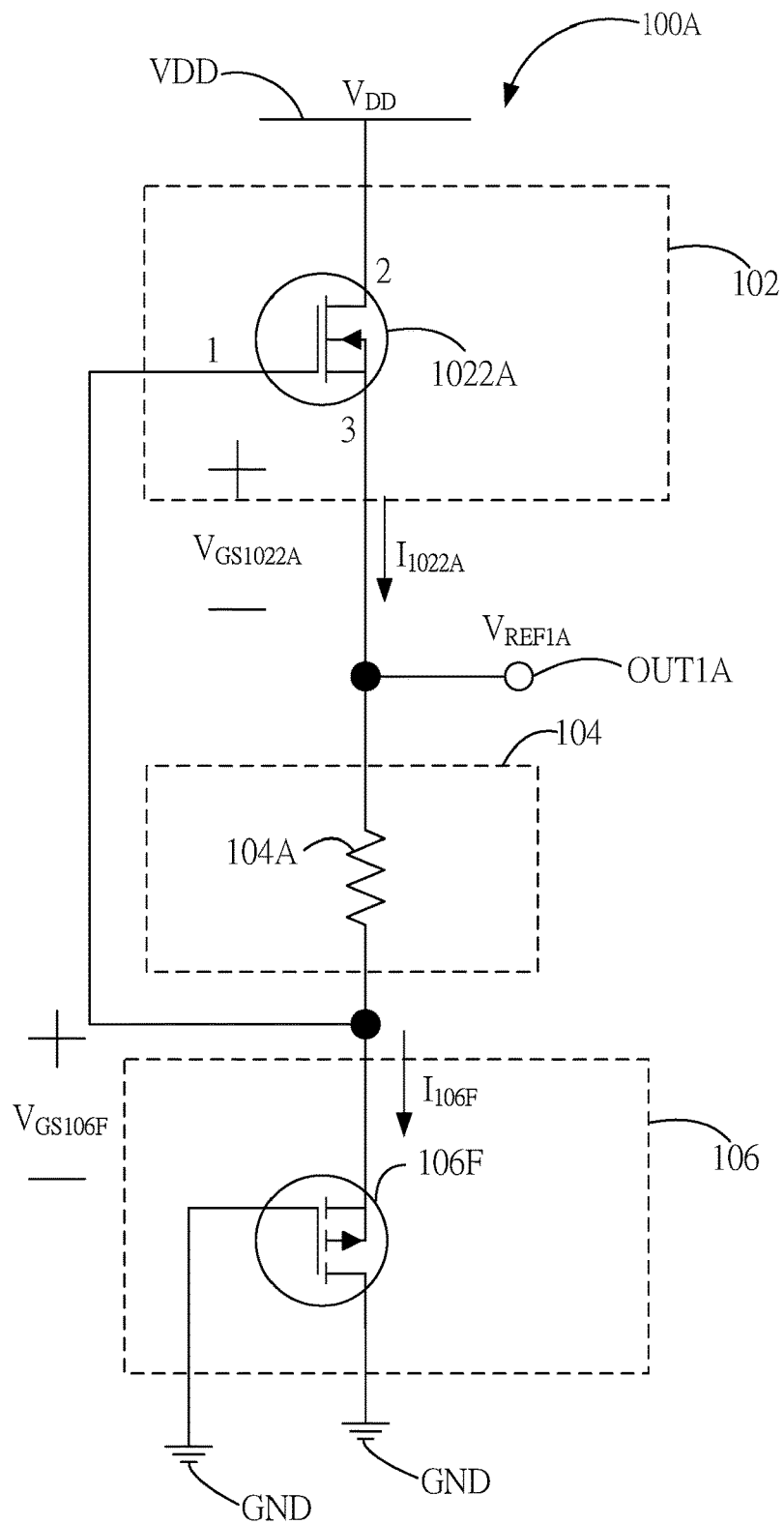
FIG. 15 shows a schematic diagram of the reference voltage circuit according to another embodiment of FIG. 4.

As shown in FIG. 15, which shows a schematic diagram of the reference voltage circuit according to another embodiment of FIG. 4. The difference between the present embodiment and the previous one is that the transimpedance device 106 is changed to an E-mode p-MOSFET 106F. Equivalently, the current source 102 provides a first transistor and the transimpedance device 106 provides a second transistor. The first terminal of the D-mode n-MOSFET 1022A is coupled to the second terminal of the resistor 104A and a third terminal of the E-mode p-MOSFET 106F. The second terminal of the D-mode n-MOSFET 1022A is coupled to the first voltage terminal VDD for receiving the first voltage $V_{DD}$. The third terminal of the D-mode n-MOSFET 1022A is coupled to the first terminal of the resistor 104A and the output terminal OUT1A. A first and a second terminal of the E-mode n-MOSFET 106E is coupled to the ground GND. Please refer to equation (5) above. The current $I_{1022A}$ of the D-mode n-MOSFET 1022A and the resistance $R_{104A}$ of the resistor 104A are used to provide the corresponding gate-to-source voltage $V_{GS1022A}$. The E-mode p-MOSFET 106F provides a gate-to-source bias $V_{GS106E}$. The relations between the source-to-gate voltage $V_{SG}$ of the D-mode n-MOSFET 1022A, the gate-to-source voltage $V_{GS}$ of the E-mode p-MOSFET 106F, and the reference voltage $V_{REF1A}$ at the output terminal OUT1A, and the corresponding $I_{1022A}$ of the D-mode n-MOSFET 1022A and $I_{106E}$ of the E-mode p-MOSFET 106F, are expressed in equations (26) to (27):

$$I_{1022A} = \tag{26}$$

$$\frac{1}{2}\mu_{n1}C_{ox1}\left(\frac{W}{L}\right)_1(V_{gs1022A} - V_{t1022A})^2 = \beta_{1022A}(V_{gs1022A} - V_{t1022A})^2$$

$$I_{106F} = \frac{1}{2}\mu_{n2}C_{ox2}\left(\frac{W}{L}\right)_2(V_{gs106E} - V_{t106E})^2 = \beta_{106E}(V_{gs106E} - V_{t106E})^2 \tag{27}$$

Let $I_{1022A} = I_{106F}$, $\beta_1(V_{gs1022A} - V_{t1022A})^2 = \beta_2(V_{gs106F} - V_{t106F})^2$ (28)

$$\sqrt{\frac{\beta_2}{\beta_1}} = \frac{V_{gs1022A} - V_{t1022A}}{V_{gs106F} - V_{t106F}} = K \tag{29}$$

The relation of the gate-to-source voltage $V_{gs1022A}$ between the first and third terminal of the D-mode n-MOSFET 1022A and the gate-to-source voltage $V_{gs106F}$ between the first and third terminal of the E-mode p-MOSFET 106F is expressed in equation (30):

$$V_{gs1022A} - V_{t1022A} = K(V_{gs106F} - V_{t106F}) \tag{31}$$

$$\alpha V_{t1022A} - V_{t1022A} = K(V_{REF1A} - V_{sg1022A} - V_{t106F}) \tag{32}$$

$$= K(V_{REF1A} - V_{sg1022A} - V_{t106F})$$

$$= K(V_{REF1A} + \alpha V_{t1022A} - V_{t106F})$$

$$V_{REF1A} = V_{t106F} - \left(\frac{1+\alpha}{K} + \alpha\right)V_{t1022A} \tag{33}$$

Let $\frac{\partial}{\partial T}V_{t106F} = \left(\frac{1+\alpha}{K} + \alpha\right)\frac{\partial}{\partial T}V_{t1022A} \rightarrow \frac{\partial}{\partial T}V_{REF1A} = 0$ (34)

According to equations (32) to (34), it is known that by further using the gate-to-source voltage $V_{GS1022A}$ between the first and third terminal of the D-mode n-MOSFET 1022A and the gate-to-source voltage $V_{GS106F}$ between the first and third terminal of the E-mode p-MOSFET 106F, the temperature coefficient of the reference voltage $V_{REF1A}$ can approach zero.

Figure 16:
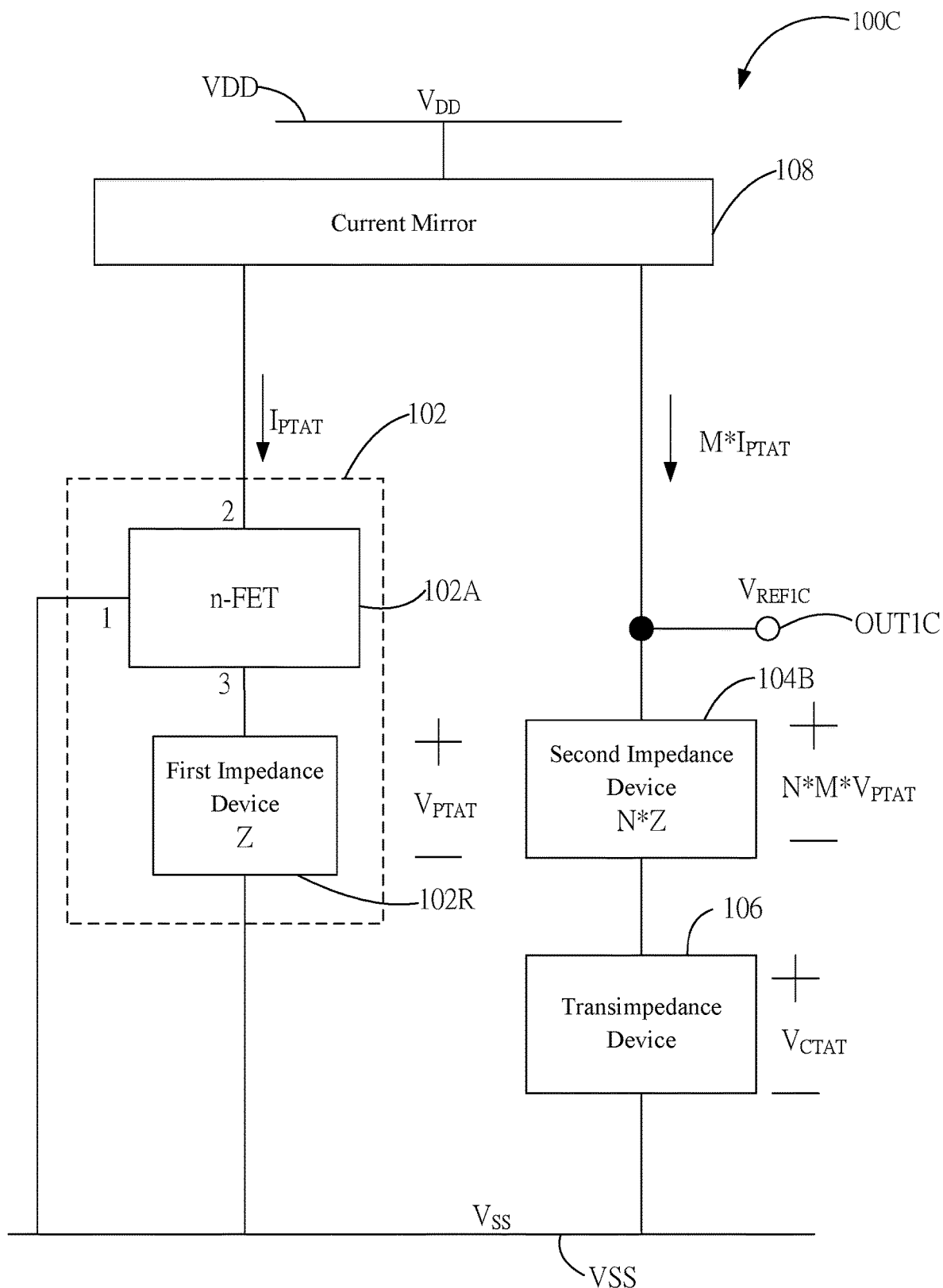
FIG. 16 shows a schematic diagram of the reference voltage circuit according to another embodiment of FIG. 3.

Please refer to FIG. 16, which shows a schematic diagram of the reference voltage circuit according to another embodiment of FIG. 3. As shown in the figure, compared to the reference voltage circuit 100A as described above, the reference voltage circuit 100C according to the present application further comprises a current mirror 108. The current source 102 includes an n-FET 102A and a first impedance device 102R. The current mirror 108 is coupled to the second terminal of the n-FET 102A as well as to the second impedance device 104B and the output terminal OUT1C. The first impedance device 102R is coupled between the third terminal of the n-FET 102A and the second voltage terminal VSS. The transimpedance device 106 according to the present embodiment is coupled between the second impedance device 104B and the second voltage terminal VSS. Since the positive coefficient current $I_{PTAT}$ generated by the current source 102 is mirrored by the current mirror 108 and giving a current-mirror current $M*I_{PTAT}$ to the second impedance device 104B and the impedance $N*Z$ of the second impedance device 104B is N times of the impedance Z of the first impedance device 102R, the positive temperature coefficient voltage generated by the second impedance device 104B is $N*M*V_{PTAT}$, which is $N*M$ times of the positive temperature coefficient voltage $V_{PTAT}$ generated by the first impedance device 102R. Likewise, the transimpedance device 106 also generates a negative temperature coefficient voltage $V_{CTAT}$. Thereby, the reference voltage $V_{REF1C}$ at the output terminal OUT1C is expressed in equation (35) below:

$$V_{REF1C}=V_{SS}+V_{CTAT}+N*M*V_{PTAT} \quad (35)$$

According to equation (35), the reference voltage $V_{REF1C}$ according to the present embodiment is the second voltage $V_{SS}$ plus the positive temperature coefficient voltage $N*M*V_{PTAT}$ and the negative temperature coefficient voltage $V_{CTAT}$.

Figure 17:
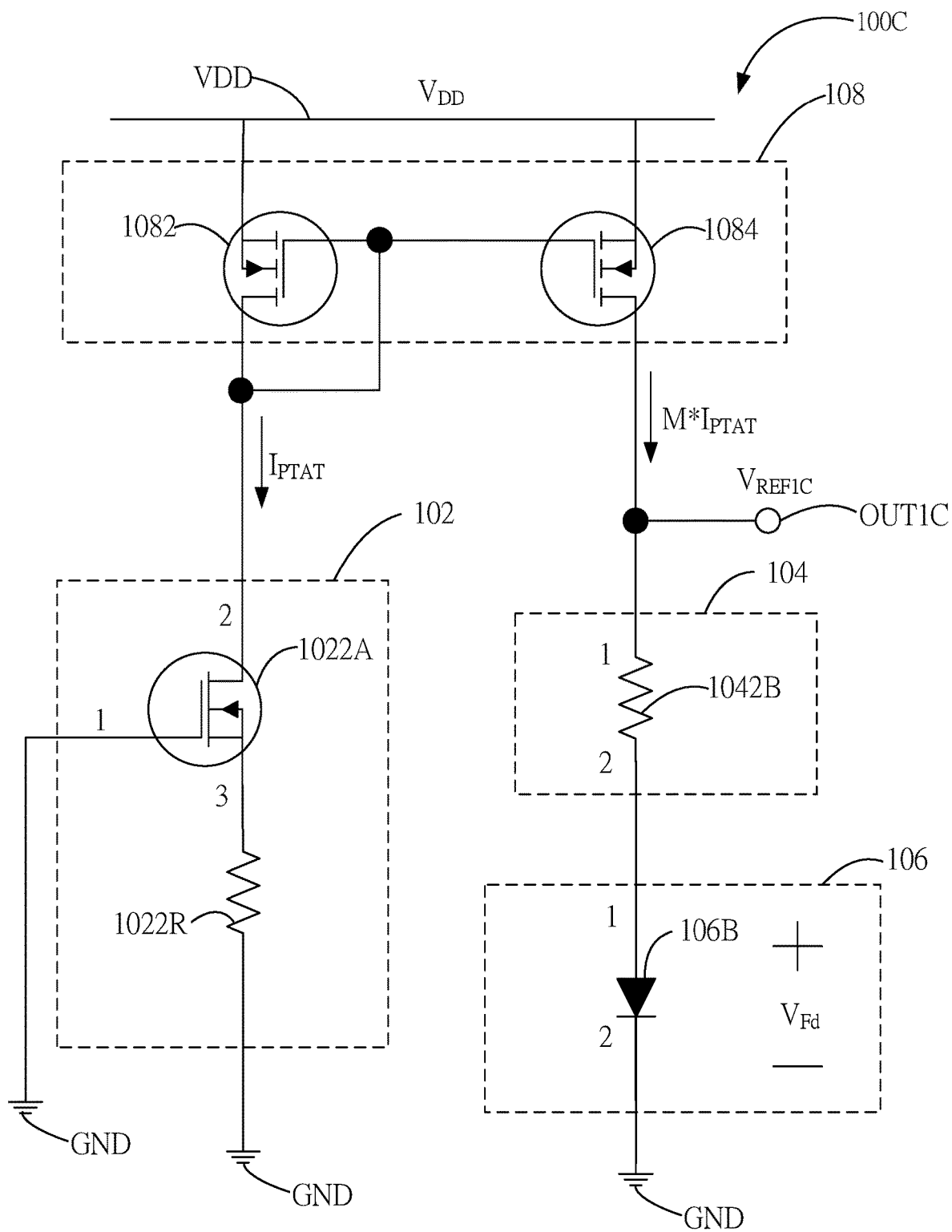
FIG. 17 shows a schematic diagram of the reference voltage circuit according to another embodiment of FIG. 16.

As shown in FIG. 17, which shows a schematic diagram of the reference voltage circuit according to another embodiment of FIG. 16. The current source 102 according to the present embodiment includes the D-mode n-MOSFET 1022A and the first resistor 1022R. The current mirror 108 according to the present embodiment includes current-mirror transistors 1082, 1084. The impedance device 104 is the second resistor 1042B. The current-mirror transistor 1082 is coupled to the second terminal of the D-mod n-MOSFET 1022A. The current-mirror transistor 1084 is coupled to the second resistor 1042B and the output terminal OUT1C. The first resistor 1022R is coupled between the third terminal of the n-FET 102A and the ground GND. Since the positive coefficient current $I_{PTAT}$ generated by the current source 102 is mirrored by the current mirror 108 and giving a current-mirror current $M*I_{PTAT}$ to the second resistor 1042B, meanwhile the diode 106B generates the forward bias $V_{FD}$, the second voltage $V_{SS}$ at the second voltage terminal VSS is zero. Thereby, the reference voltage $V_{REF1C}$ at the output terminal OUT1C is expressed in equations (36)-(37) below:

$$V_{REF1C} = V_{FD} + M \times I_{PTAT} \times R_{1042B} = V_{FD} - M \times \frac{R_{1042B}}{R_{1022R}} \times \alpha V_{t1022A} \quad (36)$$

$$\text{Let } \frac{\partial}{\partial T} V_{FD} = M \times \frac{R_{1042B}}{R_{1022R}} \times \alpha \frac{\partial}{\partial T} V_{t1022A} \rightarrow \frac{\partial}{\partial T} V_{REF1C} = 0 \quad (37)$$

According to equations (36) and (37), it is known that the reference voltage $V_{REF1C}$ corresponds to the forward bias $V_{FD}$ and the threshold voltage $V_{t1022A}$ of the D-mode n-MOSFET 1022A.

Figure 18:
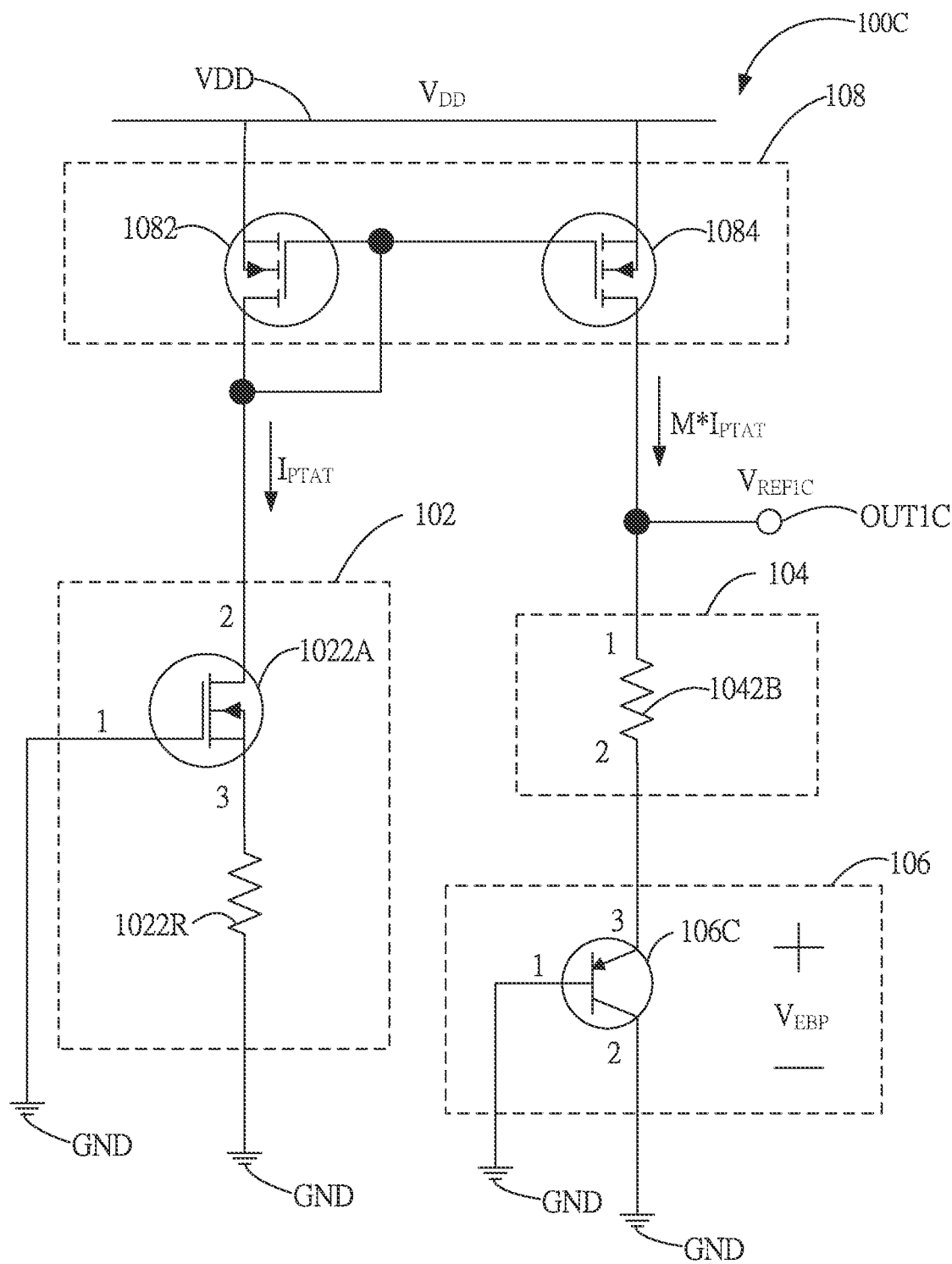
FIG. 18 shows a schematic diagram of the reference voltage circuit according to another embodiment of FIG. 16.

Please refer to FIG. 18, which shows a schematic diagram of the reference voltage circuit according to another embodiment of FIG. 16. The difference between FIG. 17 and FIG. 18 is that, in FIG. 18, the transimpedance device 106 is a PNP BJT 1064A. Since the positive coefficient current $I_{PTAT}$ generated by the current source 102 is mirrored by the current mirror 108 and giving a current-mirror current $M*I_{PTAT}$ to the second resistor 1042B, the reference voltage $V_{REF1C}$ at the output terminal OUT1C is expressed in equations (38)-(39) below:

$$V_{REF1C} = V_{EBP} + M \times I_{PTAT} \times R_{1042B} \quad (38)$$

$$= V_{EBP} - M \times \frac{R_{1042B}}{R_{1022R}} \times \alpha V_{t1022A}$$

$$\text{Let } \frac{\partial}{\partial T} V_{EBP} = M \times \frac{R_{1042B}}{R_{1022R}} \times \alpha \frac{\partial}{\partial T} V_{t1022A} \rightarrow \frac{\partial}{\partial T} V_{REF1C} = 0 \quad (39)$$

According to equations (38) and (39), it is known that the reference voltage $V_{REF1C}$ corresponds to the forward bias $V_{EBP}$ and the threshold voltage $V_{t1022A}$ of the D-mode n-MOSFET 1022A.

Figure 19:
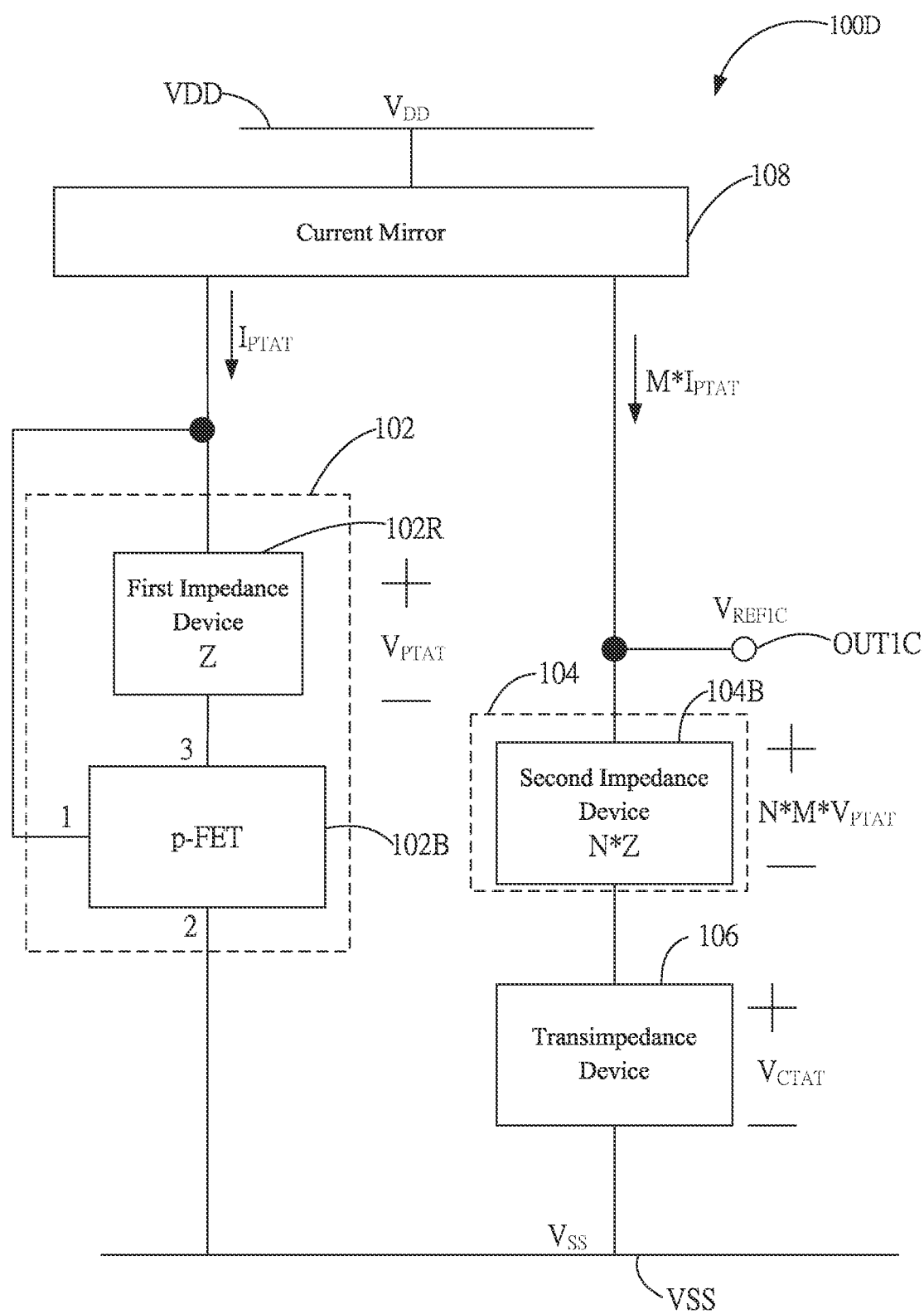
FIG. 19 shows a schematic diagram of the reference voltage circuit according to another embodiment of FIG. 3.

Please refer to FIG. 19, which shows a schematic diagram of the reference voltage circuit according to another embodiment of FIG. 3. As shown in the figure, compared to the reference voltage circuit 100C as described above, in the reference voltage circuit 100D according to the present application, the current source 102 includes a p-FET 102A and a first impedance device 102R. The current mirror 108 is coupled to the first impedance device 102R as well as to the second impedance device 104B and the output terminal OUT1D. The first impedance device 102R is coupled between the third terminal of the p-FET 102B and the current mirror 108 and to the first terminal of the p-FET 102B. The transimpedance device 106 according to the present embodiment is coupled between the second impedance device 104B and the second voltage terminal VSS. Since the magnification of the positive coefficient current $I_{PTAT}$ and the magnification of impedance are identical to the previous embodiment, the details will not be repeated here. Likewise, the transimpedance device 106 also generates a negative temperature coefficient voltage $V_{CTAT}$. Thereby, the reference voltage $V_{REF1D}$ at the output terminal OUT1D is expressed in equation (40) below:

$$V_{REF1D}=V_{SS}+V_{CTAT}+N*M*V_{PTAT} \quad (40)$$

According to equation (40), the reference voltage $V_{REF1D}$ according to the present embodiment is the second voltage $V_{SS}$ plus the positive temperature coefficient voltage $N*M*V_{PTAT}$ and the negative temperature coefficient voltage $V_{CTAT}$. Thereby, the reference voltage $V_{REF1D}$ given by equation (40) is equal to the reference voltage $V_{REF1C}$ given by equation (35).

The above embodiments disclose low-side bandgap reference voltage circuits. In addition, the present application can further provide high-side bandgap reference voltage circuits, as described in the following.

Figure 20:
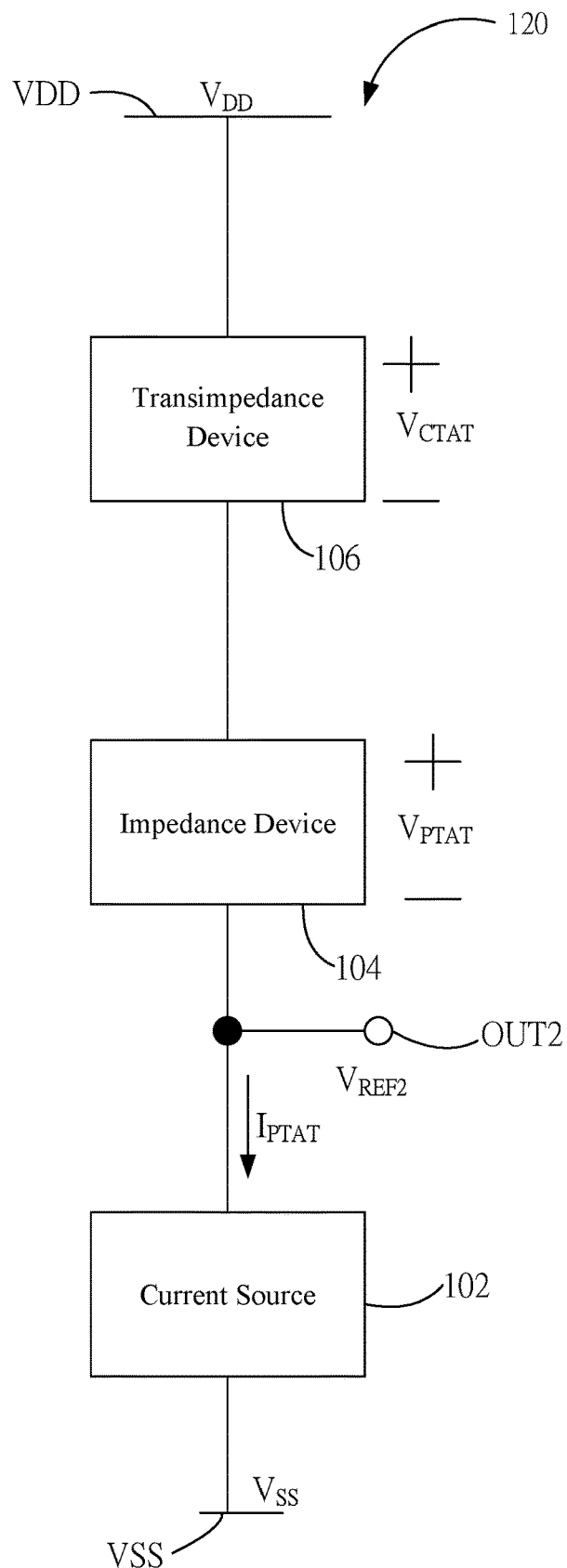
FIG. 20 shows a schematic diagram of the reference voltage circuit according to the second embodiment of the present application.

Please refer to FIG. 20, which shows a schematic diagram of the reference voltage circuit according to the second embodiment of the present application. The reference voltage circuit 120 according to the present embodiment is a high-side bandgap reference voltage circuit. The differences between the present embodiment and the first embodiment of FIG. 3 are that the current source 102 of the reference voltage circuit 120 according to the present embodiment is coupled to the second voltage terminal VSS instead, and the transimpedance device 106 is coupled to the first voltage terminal VDD instead. In other words, the electrical connection according to the first embodiment of FIG. 3 is reversed. Thereby, the output terminal OUT2 is still coupled between the current source 102 and the impedance device 104.

Figure 21:
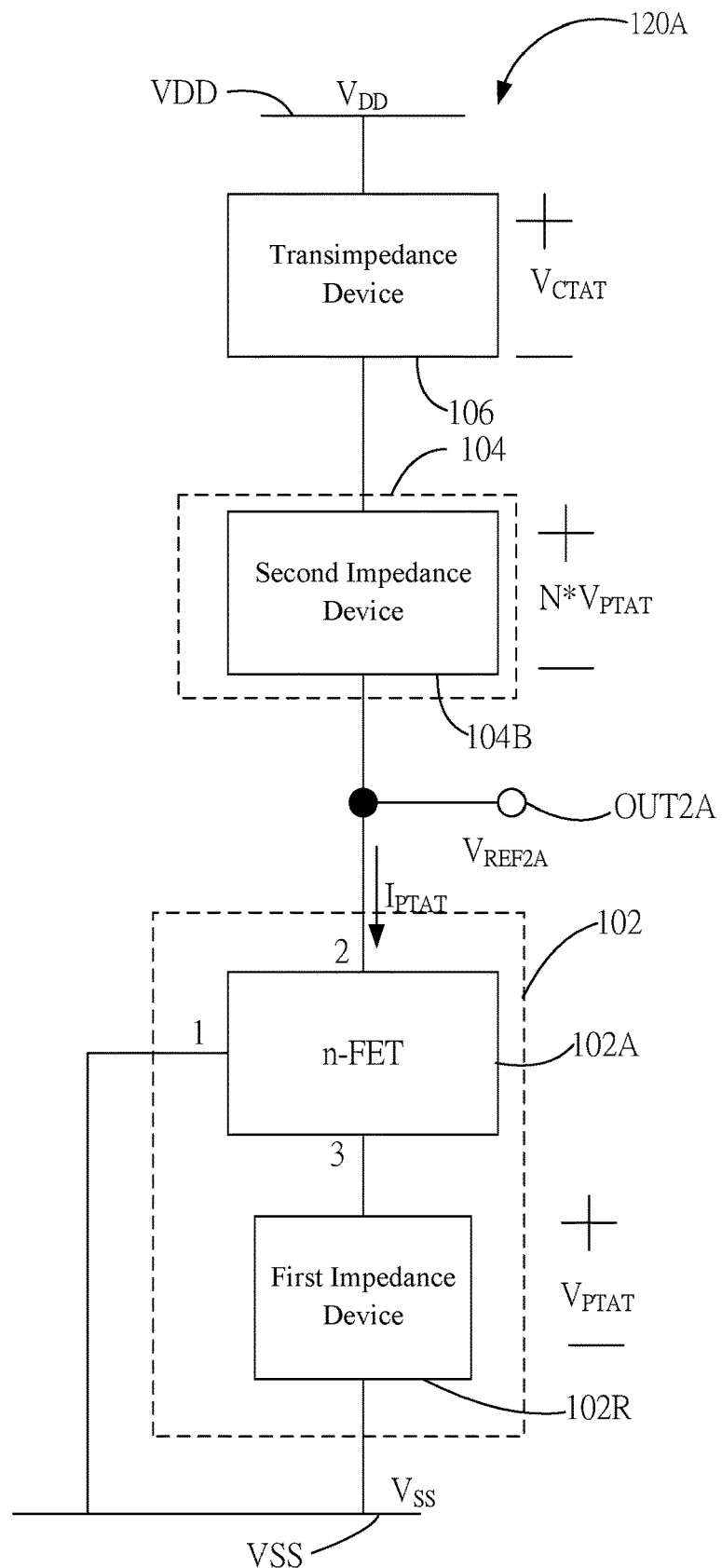
FIG. 21 shows a schematic diagram of the reference voltage circuit according to another embodiment of FIG. 20.

FIG. 21 shows a schematic diagram of the reference voltage circuit according to another embodiment of FIG. 20. As shown in the figure, the reference voltage circuit 120A according to the present embodiment is the detailed circuit of the reference voltage circuit 120. The current source 102 according to the present embodiment includes an n-FET 102A and a first impedance device 102R. A second impedance device 104B is disposed between the current source 102 and the transimpedance 106. The first terminal of the n-FET 102A is coupled to the second voltage terminal VSS. The second terminal of the n-FET 102A is coupled to the output terminal OUT2A and the second impedance device 104. The third terminal of the n-FET 102A is coupled to the first impedance device 102R and to the second voltage terminal VSS via the first impedance device 102R. Thereby, the n-FET 102A provides the positive temperature coefficient current $I_{PTAT}$. In addition, the impedance $Z_{104B}$ of the second impedance device 104B is N times of the impedance $Z_{102R}$ of the first impedance device 102R. Thereby, the positive temperature coefficient voltage $N*V_{PTAT}$ generated by the second impedance device 104B is N times of the positive temperature coefficient voltage $V_{PTAT}$ generated by the first impedance device 102R. Besides, the transimpedance device 106 generates the negative temperature coefficient voltage $V_{CTAT}$. Thereby, the reference voltage $V_{REF2A}$ at the output terminal OUT2A according to the present embodiment is expressed in equation (41) below:

$$V_{REF2A} = V_{DD} - (V_{CTAT} + N^*V_{PTAT}) \quad (41)$$

According to the above equation, the reference voltage $V_{REF2A}$ according to the present embodiment is the first voltage $V_{DD}$ at the first voltage terminal VDD minus the positive temperature coefficient voltage $N^*V_{PTAT}$ generated by the second impedance device 104B and the negative temperature coefficient voltage $V_{CTAT}$ generated by the transimpedance device 106.

Figure 22:
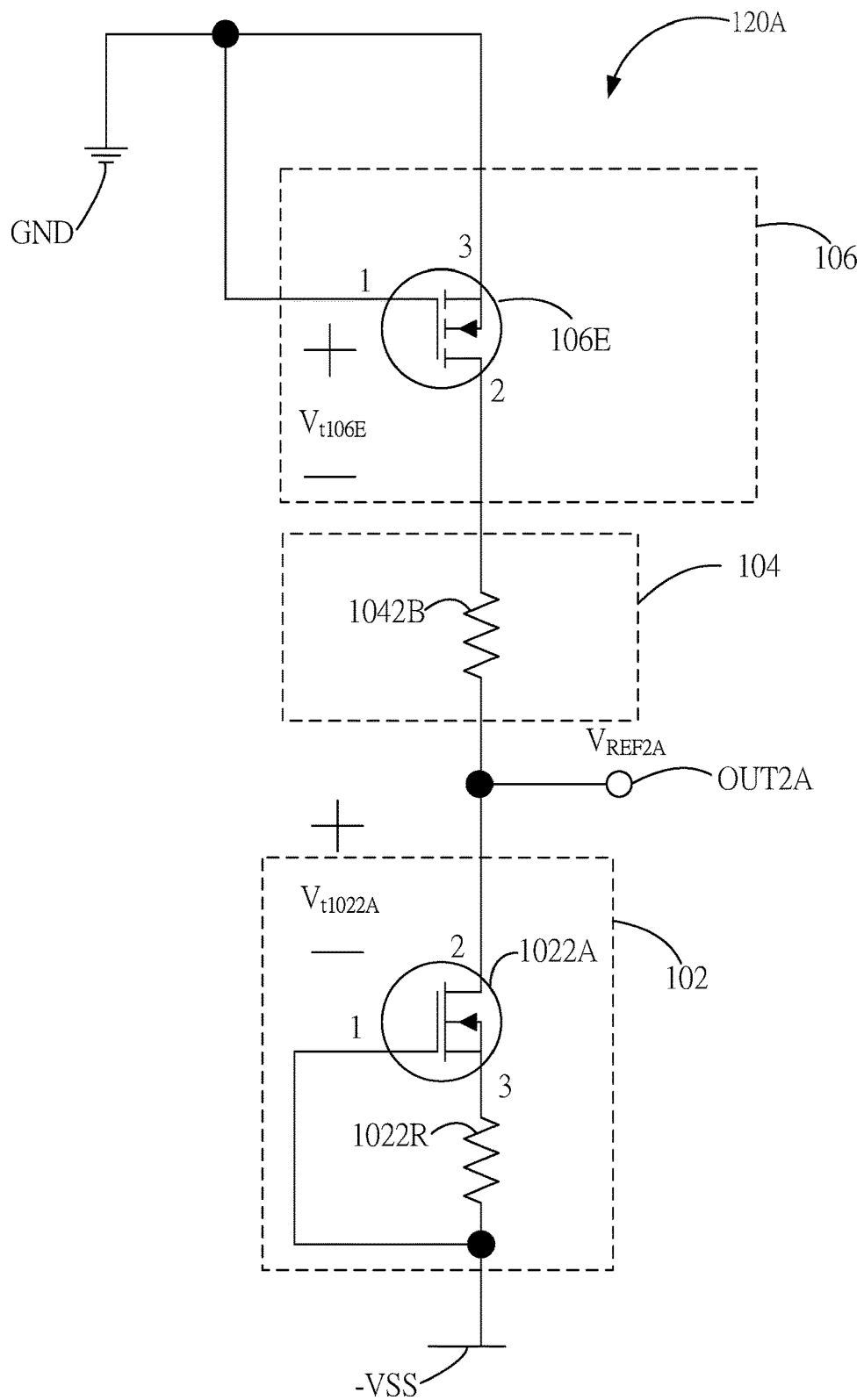
FIG. 22 shows a schematic diagram of the reference voltage circuit according to another embodiment of FIG. 21.

FIG. 22 shows a schematic diagram of the reference voltage circuit according to another embodiment of FIG. 21. As shown in the figure, the current source 102 of the reference voltage circuit 120A according to the present embodiment comprises a D-mode n-MOSFET 1022A and a first resistor 1022R. Namely, the n-FET 102A according to the previous embodiment is changed to the D-mode n-MOSFET 1022A and the first impedance device 102R according to the previous embodiment is changed to the first resistor 1022R. Besides, the second impedance device 1042B is a second resistor 1042B and the transimpedance device 106 is an E-mode n-MOSFER 106E. The first and second terminal of the E-mode n-MOSFER 106E are coupled to the ground GND. The third terminal of the E-mode n-MOSFER 106E is coupled to the second resistor 1042B. The first terminal of the D-mode n-MOSFET 1022A is coupled to the inverted second voltage terminal −VSS. The second terminal of the D-mode n-MOSFET 1022A is coupled to the output terminal OUT2A and the second resistor 1042B. The third terminal of the D-mode n-MOSFET 1022A is coupled to the first resistor 1022R and to the inverted second voltage terminal −VSS via the first resistor 1022R.

Accordingly, the D-mode n-MOSFET 1022A provides the positive temperature coefficient current $I_{PTAT}$. In addition, the resistance $R_{1042B}$ of the second impedance device 1042B is N times of the resistance $R_{1022R}$ of the first impedance device 1022R. Thereby, the relations between the source-to-gate voltage $V_{SG}$ of the D-mode n-MOSFET 1022A, the gate-to-source voltage $V_{GS}$ of the E-mode n-MOSFET 106E, and the reference voltage $V_{REF2A}$ at the output terminal OUT2A, and the corresponding $I_{1022A}$ of the D-mode n-MOSFET 1022A and $I_{106E}$ of the E-mode n-MOSFET 106E, are expressed in equations (18) to (19):

Let $I_{1022A} = I_{106E}$, equations (20) and (21) will be solved. The relation of the gate-to-source voltage $V_{GS1022A}$ between the first and third terminal of the D-mode n-MOSFET 1022A and the gate-to-source voltage $V_{GS106E}$ between the first and third terminal of the E-mode n-MOSFET 106E is expressed in equation (22). Then equations (42) and (43) will be solved:

$$\alpha V_{t1022A} - V_{t1022A} = K(V_{GS106E} - V_{t106E}) \quad (42)$$

$$V_{GS106E} = \frac{1-\alpha}{K} V_{t1022A} + V_{t106E} \quad (43)$$

Substituting equation (43) into equation (41), equation (44) will be solved:

$$V_{REF2A} = 0 - (V_{GS106E} + I_{1022A} \times R_{1042B}) \quad (44)$$

-continued $$= 0 - \left( \frac{a-1}{K} V_{t1022A} + V_{t106E} - \frac{R_{1042B}}{R_{1022R}} \alpha V_{t1022A} \right)$$

$$= \left( \frac{R_{1042B}}{R_{1022R}} \alpha - \frac{a-1}{K} \right) V_{t1022A} - V_{t106E}$$

Let $\dfrac{\partial}{\partial T} V_{t106E} = \left( \dfrac{R_{1042B}}{R_{1022R}} \alpha - \dfrac{a-1}{K} \right) \dfrac{\partial}{\partial T} V_{t1022A} \to \dfrac{\partial}{\partial T} V_{REF2A} = 0$ (45)

According to equations (44) to (45), it is known that by using the threshold voltage $V_{t1022A}$ of the first and third terminal of the D-mode n-MOSFET 1022A and the threshold voltage $V_{t106E}$ of the first and third terminal of the E-mode n-MOSFET 106E, the temperature coefficient of the reference voltage $V_{REF2A}$ can approach zero.

Figure 23:
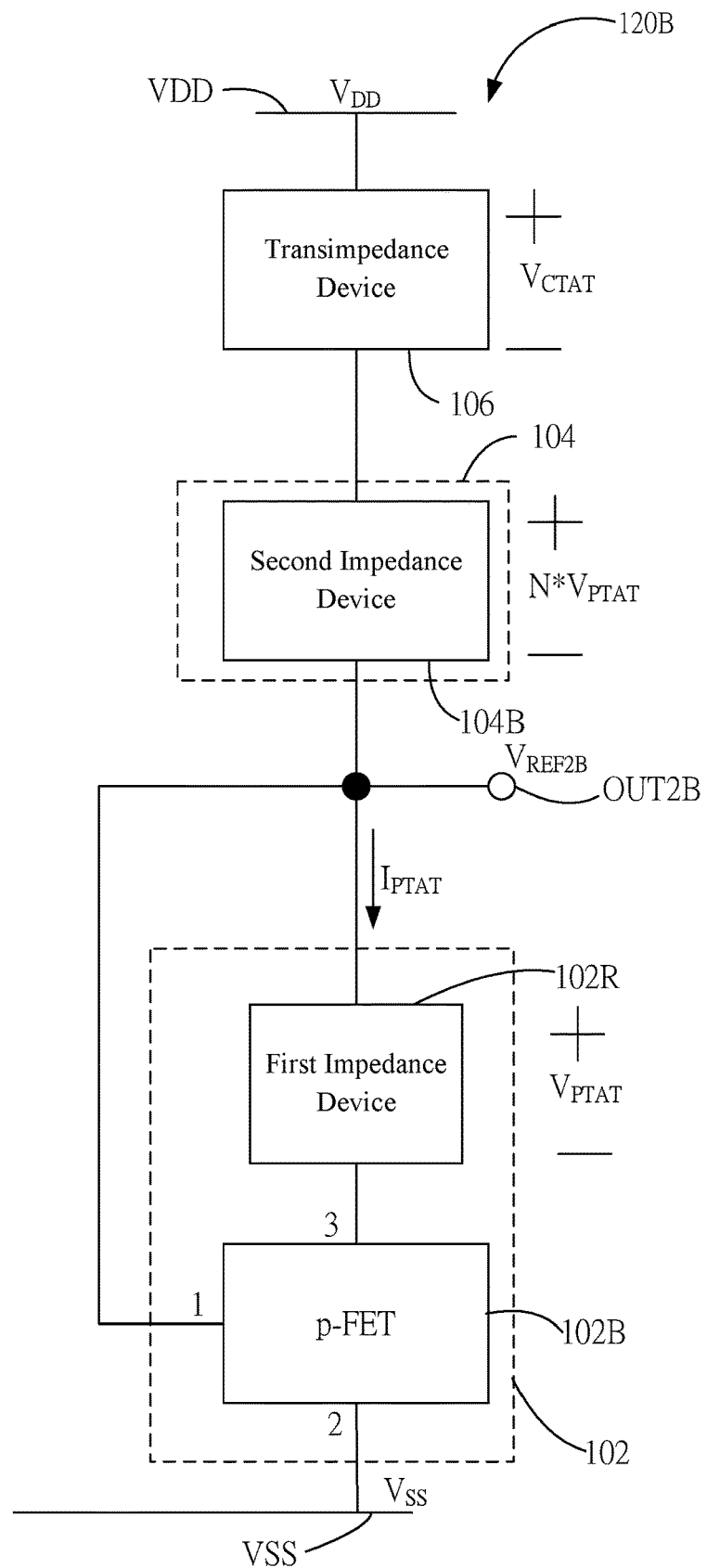
FIG. 23 shows a schematic diagram of the reference voltage circuit according to another embodiment of FIG. 20.

FIG. 23 shows a schematic diagram of the reference voltage circuit according to another embodiment of FIG. 20. Compared to the reference voltage circuit 120A according to the previous embodiment, the current source 102 in the reference voltage circuit 120B according to the present embodiment is changed to include a p-FET 102B and a first impedance device 102R. The first terminal of the p-FET 102B is coupled to the output terminal OUT2B and the second impedance device 104. The second terminal of the p-FET 102B is coupled to the second voltage terminal VSS. The third terminal of the p-FET 102B is coupled to the first impedance device 102R and to the output terminal OUT2B and the second impedance device 104 via the first impedance device 102R. Thereby, the p-FET 102B provides the positive temperature coefficient current $I_{PTAT}$. Besides, the transimpedance device 106 generates the negative temperature coefficient voltage $V_{CTAT}$. The magnification of impedance is identical to the previous embodiment. Thereby, the reference voltage $V_{REF2B}$ at the output terminal OUT2B according to the present embodiment is expressed in equation (46) below:

$$V_{REF2B} = V_{DD} - (V_{CTAT} + N^*V_{PTAT}) \quad (46)$$

According to the above equation, the reference voltage $V_{REF2B}$ according to the present embodiment is also the first voltage $V_{DD}$ at the first voltage terminal VDD minus the positive temperature coefficient voltage $N^*V_{PTAT}$ generated by the second impedance device 104B and the negative temperature coefficient voltage $V_{CTAT}$ generated by the transimpedance device 106.

Figure 24:
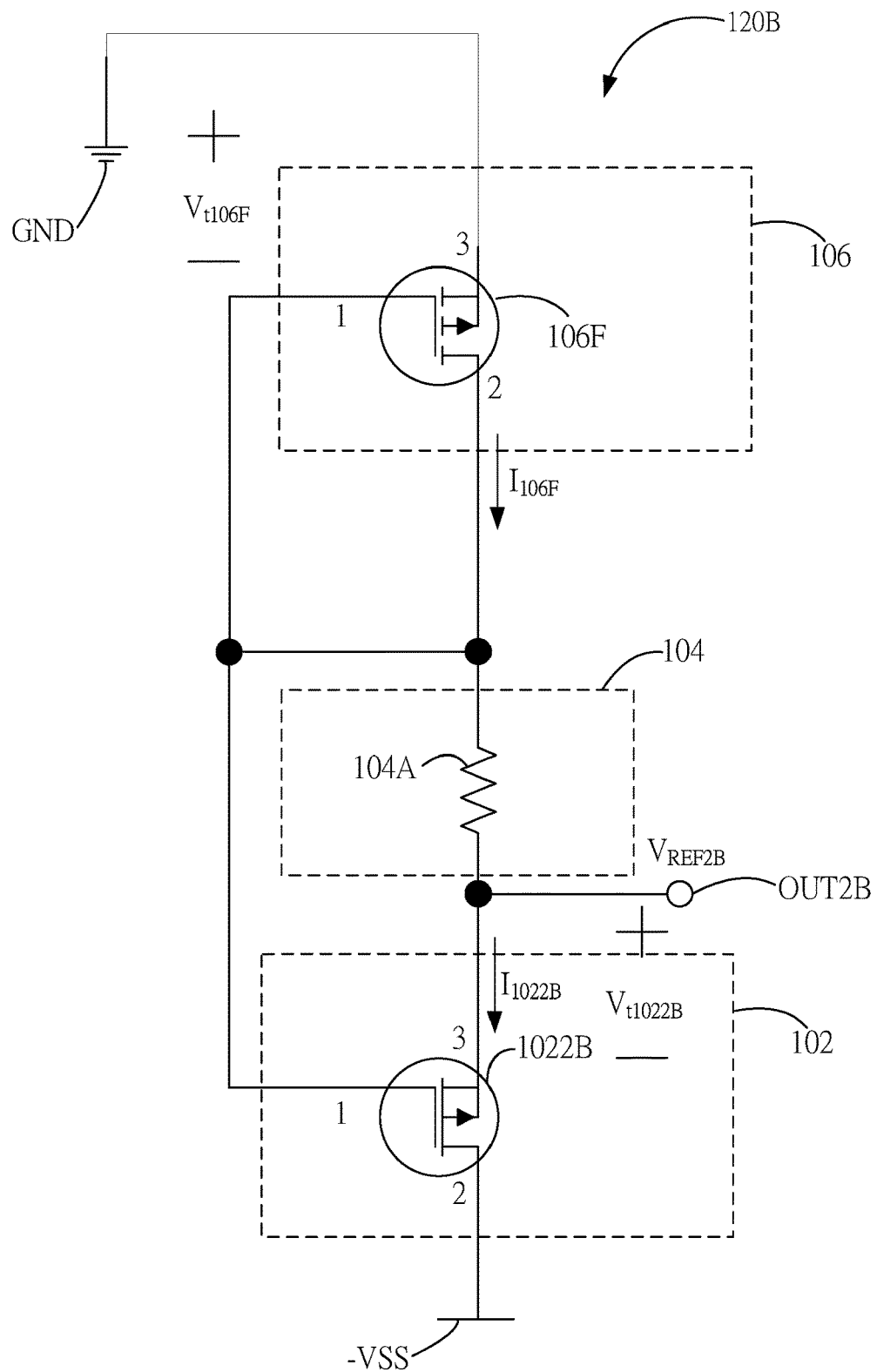
FIG. 24 shows a schematic diagram of the reference voltage circuit according to another embodiment of FIG. 23.

FIG. 24 shows a schematic diagram of the reference voltage circuit according to another embodiment of FIG. 23. The current source 102 is a D-mode p-MOSFET 1022B. The D-mode p-MOSFET 1022B and the second resistor 1042B are equivalent to the p-FET 102B and the first impedance device 102R together with the second impedance device 104B. The transimpedance device 106 is an E-mode p-MOSFET 106F. The third terminal of the E-mode p-MOSFET 106F is coupled to the ground GND. The first terminal of the E-mode p-MOSFET 106F is coupled to the second terminal of the E-mode p-MOSFET 106F, the first terminal of the D-mode p-MOSFET 1022B, the output terminal OUT2B, and the second resistor 1042B. The second terminal of the D-mode p-MOSFET 1022B is coupled to the inverted second voltage terminal −VSS. The third terminal of the D-mode p-MOSFET 1022B is coupled to the output terminal OUT2B and the second resistor 1042B. Thereby, the D-mode p-MOSFET 1022B provides the positive temperature coefficient current $I_{PTAT}$. The magnification of impedance is identical to the previous embodiment. The current $I_{1022B}$ of the D-mode p-MOSFET 1022B and the resistance $R_{1042B}$ of the second resistor 1042B provide the corresponding gate-to-source voltage $V_{GS1022B}$. The E-mode p-MOSFET 106F provides the gate-to-source bias $V_{GS106F}$. The relations between the source-to-gate voltage $V_{SG}$ of the D-mode p-MOSFET 1022B, the gate-to-source voltage $V_{GS106F}$ of the E-mode p-MOSFET 106F, and the reference voltage $V_{REF2B}$ at the output terminal OUT2B, and the corresponding $I_{1022B}$ of the D-mode p-MOSFET 1022B and $I_{106F}$ of the E-mode p-MOSFET 106F, are expressed in equations (47) and (48) below:

$$I_{1022B} = \frac{1}{2}\mu_{n1}C_{ox1}\left(\frac{W}{L}\right)_1 (V_{GS1022B} - V_{t1022B})^2 = \beta_{1022B}(V_{GS1022B} - V_{t1022B})^2 \quad (47)$$

$$I_{106F} = \frac{1}{2}\mu_{n2}C_{ox2}\left(\frac{W}{L}\right)_2 (V_{GS106F} - V_{t106F})^2 = \beta_{106F}(V_{GS106F} - V_{t106F})^2 \quad (48)$$

Let $I_{1022A} = I_{106F}$, equations (49) and (50) will be solved:

$$\beta_1(V_{GS1022B} - V_{t1022B})^2 = \beta_2(V_{GS106F} - V_{t106F})^2 \quad (49)$$

$$\sqrt{\frac{\beta_2}{\beta_1}} = \frac{V_{GS1022B} - V_{t1022B}}{V_{GS106F} - V_{t106F}} = K \quad (50)$$

The relation of the gate-to-source voltage $V_{GS1022B}$ between the first and third terminal of the D-mode p-MOSFET 1022B and the gate-to-source voltage $V_{GS106F}$ between the first and third terminal of the E-mode p-MOSFET 106F is expressed in equation (51):

$$V_{GS1022B} - V_{t1022B} = K(V_{GS106F} - V_{t106F}) \quad (51)$$

$$\alpha V_{t1022A} - V_{t1022A} = K(V_{REF2B} + V_{GS1022A} - V_{t106F}) \quad (52)$$

$$= K(V_{REF2B} + \alpha V_{t1022B} - V_{t106F})$$

$$V_{REF2B} = V_{t106F} - \left(\frac{1-\alpha}{K} + \alpha\right)V_{t1022B} \quad (53)$$

Let $\frac{\partial}{\partial T}V_{t106F} = \left(\frac{1-\alpha}{K} + \alpha\right)\frac{\partial}{\partial T}V_{t1022A} \rightarrow \frac{\partial}{\partial T}V_{REF2B} = 0 \quad (54)$ According to equations (52) to (54), it is known that by using the threshold voltage $V_{t1022B}$ of the D-mode p-MOSFET 1022B and the threshold voltage $V_{t106F}$ of the first and third terminal of the E-mode p-MOSFET 106F, the temperature coefficient of the reference voltage $V_{REF2B}$ can approach zero.

Figure 25:
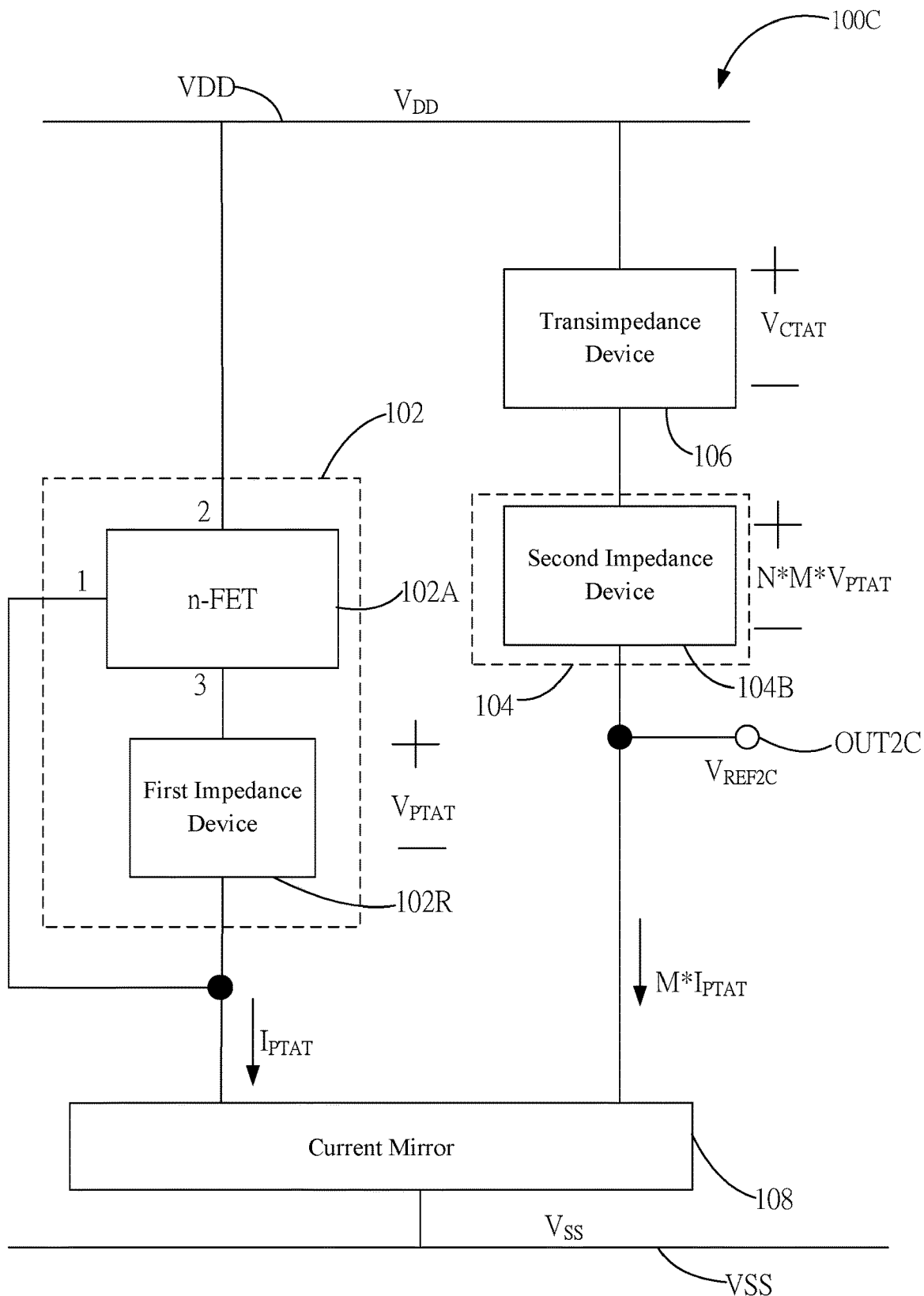
FIG. 25 shows a schematic diagram of the reference voltage circuit according to another embodiment of FIG. 20.

FIG. 25 shows a schematic diagram of the reference voltage circuit according to another embodiment of FIG. 20. The difference between the reference voltage circuit 120C of FIG. 25 and the reference voltage circuit 120A of FIG. 21 is that the reference voltage circuit 120C of FIG. 25 further includes a current mirror 108. Please refer to FIG. 16. The electrical connection of the reference voltage circuit 120C according to the present embodiment is the reverted connection of the reference voltage circuit 100C. The current mirror 108 is coupled to the second voltage terminal VSS. The first terminal of the n-FET 102A and the first impedance device 102R are coupled to the current mirror 108. The second terminal of the n-FET 102A is coupled to the first voltage terminal VDD. The third terminal of the n-FET 102A is coupled to the first impedance device 102R. The current mirror 108 is further coupled to the second impedance device 104B and the output terminal OUT2C. By using the current magnification M of the current mirror 108, the positive temperature coefficient current $I_{PTAT}$ of the current source 102 is converted to M times and giving the current-mirror current $M*I_{PTAT}$. In addition, by using the N times of the impedance Z of the second impedance device 104B, namely, $N*Z$, $N*M$ times of the positive temperature coefficient current $I_{PTAT}$, namely, $N*M*V_{PTAT}$, will be given correspondingly. The transimpedance device 106 generates the negative temperature coefficient voltage $V_{CTAT}$. Thereby, the reference voltage $V_{REF2C}$ will be generated, as expressed in equation (55) below:

$$V_{REF2C} = V_{DD} - (V_{CTAT} + N*M*V_{PTAT}) \quad (55)$$

Figure 26:
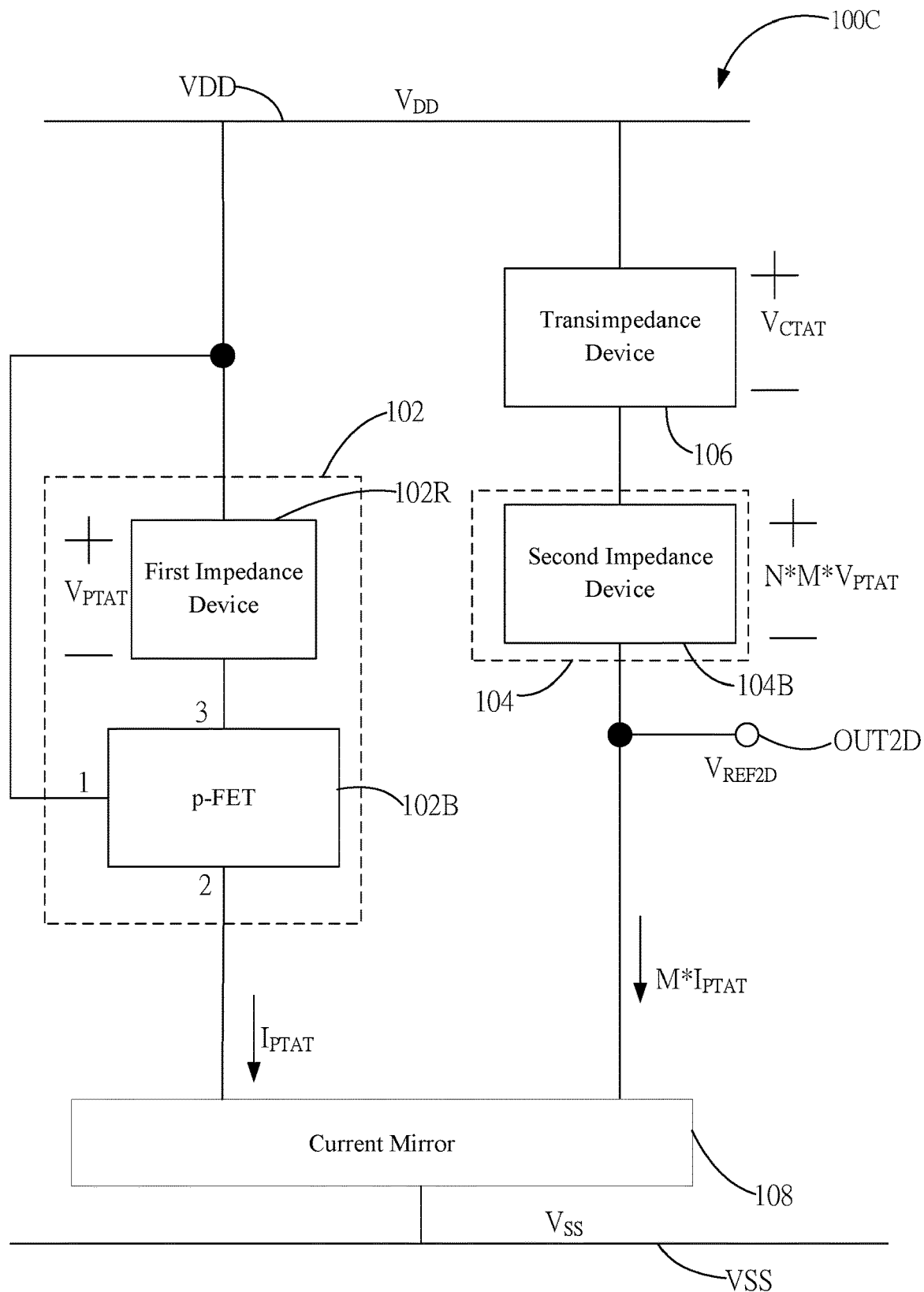
FIG. 26 shows a schematic diagram of the reference voltage circuit according to another embodiment of FIG. 20.

FIG. 26 shows a schematic diagram of the reference voltage circuit according to another embodiment of FIG. 20. Compared to the reference voltage circuit 120C according to the previous embodiment, the current source 102 in the reference voltage circuit 120D according to the present embodiment is changed to a p-FET 102B and a first impedance device 102R. Likewise, the current mirror 108 is coupled to the output terminal OUT2D and the second impedance device 104B. The first terminal of the p-FET 102B is coupled between the first impedance device 102R and the first voltage terminals VDD. The second terminal of the p-FET 102B is coupled to the current mirror 108. The third terminal of the p-FET 102B is coupled to the first impedance device 102R and to the first voltage terminal VDD via the first impedance device 102R. The p-FET 102B provides the positive temperature coefficient current $I_{PTAT}$. The magnification of impedance is identical to the previous embodiment. Thereby, the reference voltage $V_{REF2D}$ at the output terminal OUT2D according to the present embodiment is the same as equation (55) above.

According to equation (55) above, the reference voltage $V_{REF2D}$ according to the present embodiment is also the first voltage $V_{DD}$ at the first voltage terminal VDD minus the positive temperature coefficient voltage $N*M*V_{PTAT}$ generated by the second impedance device 104B and the negative temperature coefficient voltage $V_{CTAT}$ generated by the transimpedance device 106.

Figure 27A:
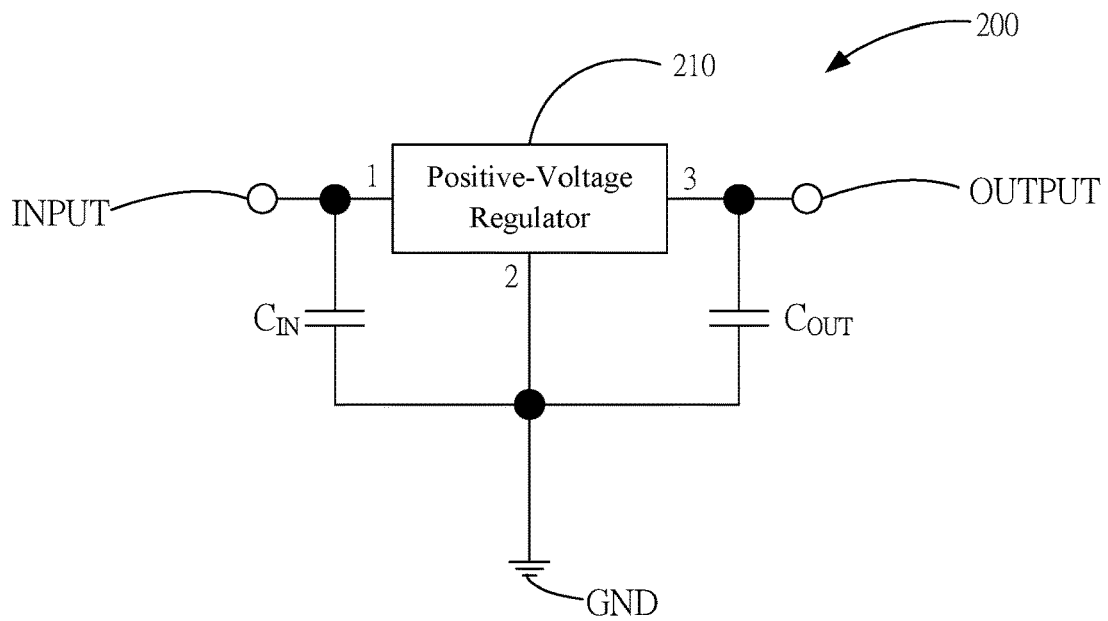
FIG. 27A shows a schematic diagram of the circuit of the first application embodiment according to the present application.
Figure 27B:
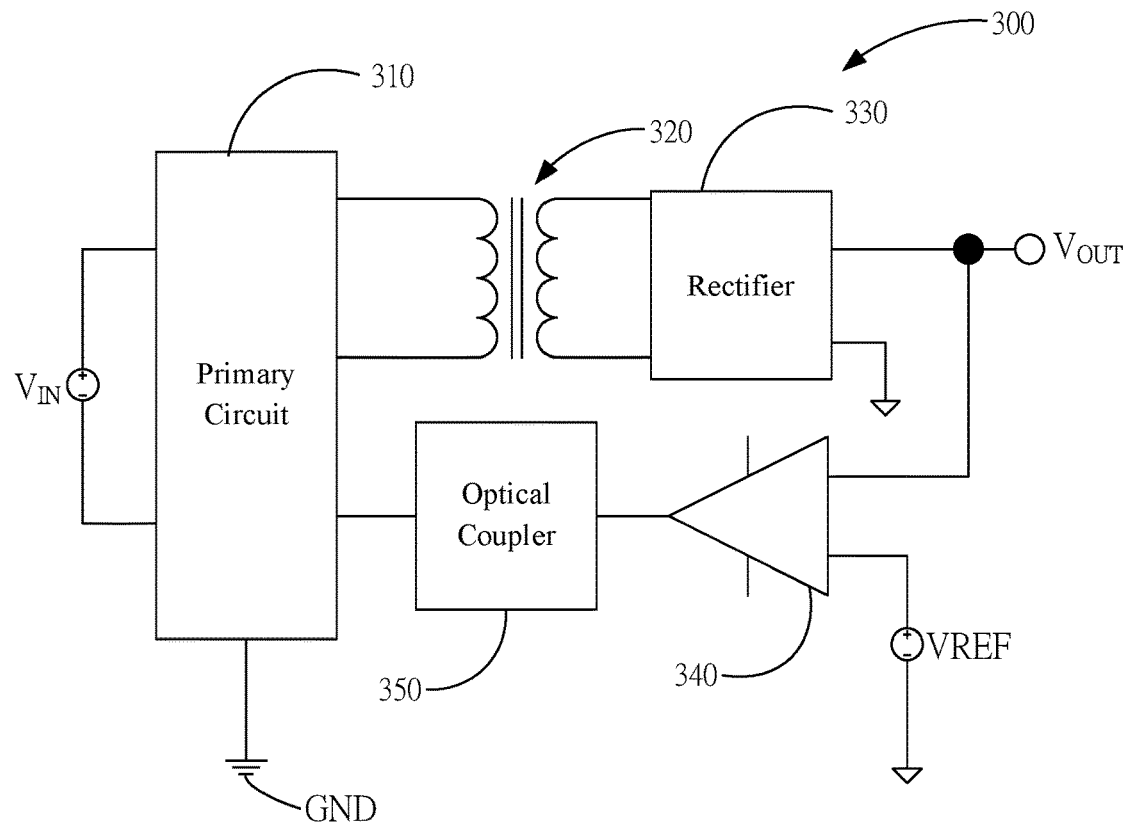
FIG. 27B shows a schematic diagram of the circuit of the second application embodiment according to the present application.
Figure 28A:
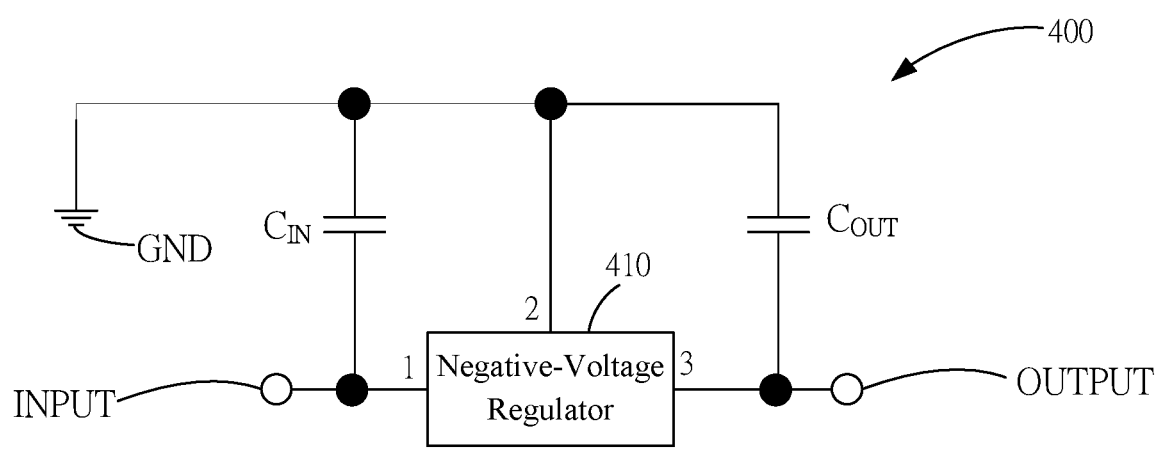
FIG. 28A shows a schematic diagram of the circuit of the third application embodiment according to the present application.
Figure 28B:
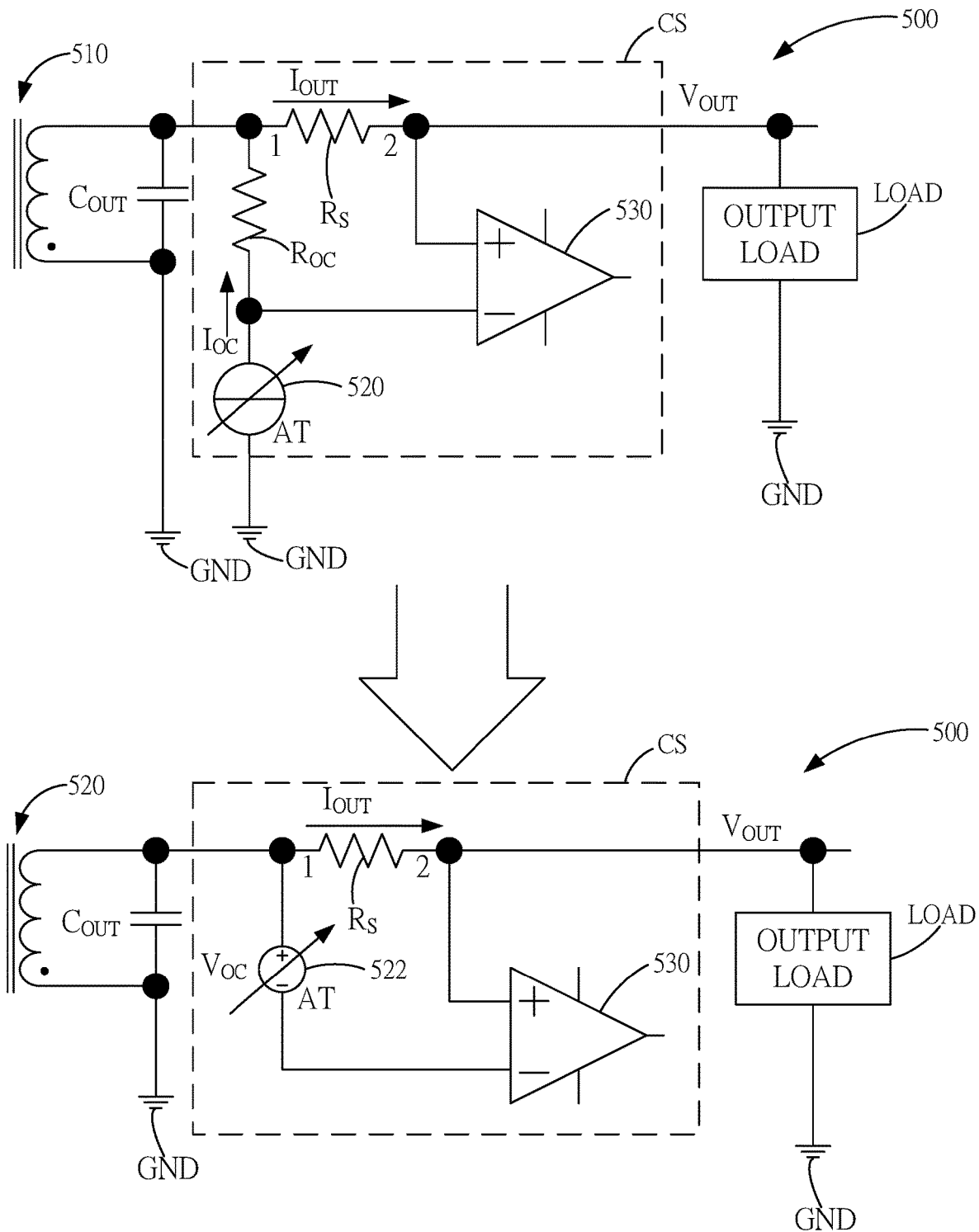
FIG. 28B shows a schematic diagram of the circuit of the fourth application embodiment according to the present application.

The above reference voltage circuits 100A~100D, 120A~120D can be applied to the following embodiments, such as the ones shown in FIGS. 27A to 28B. FIG. 27A and FIG. 27B show an embodiment for low-side reference voltage, namely, the application for the above reference voltage circuits 100A~100D. FIG. 28A and FIG. 28B show an embodiment for high-side reference voltage, namely, the application for the above reference voltage circuits 120A~120D.

FIG. 27A shows a regulator circuit 200, which includes a positive-voltage regulator 210. A first terminal of the positive-voltage regulator 210 is coupled to an input terminal INPUT and an input capacitor $C_{IN}$. A second terminal of the positive-voltage regulator 210 is coupled to the input capacitor $C_{IN}$, the ground terminal GND, and an output capacitor $C_{OUT}$. A third terminal of the positive-voltage regulator 210 is coupled to an output terminal OUTPUT and the output capacitor $C_{OUT}$. The positive-voltage regulator 210 is an application of the above reference voltage circuits 100A~100D.

FIG. 27B shows a switching power supply circuit 300, which includes an input voltage $V_{IN}$, a primary circuit 310, a transformer 320, a rectifier 330, a reference voltage $V_{REF}$, an error operational amplifier 340, and an optical coupler 350. The input voltage $V_{IN}$ is coupled to the primary circuit 310 and inputs power source to the primary circuit 310. The primary circuit 310 thereby can supply energy to the transformer 320 for outputting the converted voltage to the rectifier 330. The rectified converted voltage is used as the output voltage $V_{OUT}$. In addition, the output voltage $V_{OUT}$ is feedbacked to one input terminal of the error operational amplifier 340. The other input terminal of the error operational amplifier 340 is coupled to the reference voltage $V_{REF}$. Thereby, the error operational amplifier 340 can provide an error signal $V_{ERR}$ to the optical coupler 350. An optical coupling signal $S_{OP}$ of the optical coupler 350 is coupled to the primary circuit 310 for adjusting the energy supplied to the transformer 320. The reference voltage $V_{REF}$ is an application of the above reference voltage circuits 100A~100D.

FIG. 28A shows a regulator circuit 400, which includes a negative-voltage regulator 410. Likewise, a first terminal of the negative-voltage regulator 410 is coupled to an input terminal INPUT and an input capacitor $C_{IN}$. A second terminal of the negative-voltage regulator 410 is coupled to the input capacitor $C_{IN}$, the ground terminal GND, and an output capacitor $C_{OUT}$. A third terminal of the negative-voltage regulator 410 is coupled to an output terminal OUTPUT and the output capacitor $C_{OUT}$. The negative-voltage regulator 410 is an application of the above reference voltage circuits 120A~120D. The output terminal OUTPUT provides a negative output voltage.

FIG. 28B shows an application to a power supply unit (PSU) 500 for sensing current at the output. The PSU 500 includes a secondary side of a transformer 510, a diode 515, an output capacitor $C_{OUT}$, a current sensing resistor $R_{CS}$, an output sensing resistor $R_S$, a sensing current source $I_{CS}$, a comparator 530, and a load LOAD. The current sensing resistor $R_{CS}$, the output sensing resistor $R_S$, the sensing current source $I_{CS}$, and an operational amplifier 530 form a current sensing circuit CS. The secondary side of the transformer 510 is coupled to the diode 515 and the output capacitor $C_{OUT}$. A first terminal of the diode 515 is coupled to the secondary side of the transformer 510. A second terminal of the diode 515 is coupled to a first terminal of the output capacitor $C_{OUT}$ and a second terminal of the output capacitor $C_{OUT}$ is coupled to the ground terminal GND. The output capacitor $C_{OUT}$ is equivalently connected in parallel with the secondary side of the transformer 510. The second terminal of the diode 515 is coupled to a first terminal of the output sensing resistor $R_S$ and a first terminal of the current sensing resistor $R_{CS}$. The sensing current source $I_{CS}$ is coupled between the ground terminal GND and the current sensing resistor $R_{CS}$. A first input and a second input of the comparator 530 are coupled between the sensing current source $I_{CS}$ and the current sensing resistor $R_{CS}$ and between the output sensing resistor $R_S$ and the output load LOAD, respectively. In other words, the comparator 530 is used to detect the voltage across the output sensing resistor $R_S$, and the current sensing resistor $R_{CS}$ and the sensing current source $I_{CS}$ provide the fundamental sensing current for preventing not-sensible small signals. Thereby, one terminal of the output sensing resistor $R_S$ is coupled to the output capacitor $C_{OUT}$, the current sensing resistor $R_{CS}$, and the secondary side of the transformer 510. The other terminal of the output sensing resistor $R_S$ is coupled to the comparator 530 and the output load LOAD. Besides, the sensing current source $I_{CS}$ and the current sensing resistor $R_{CS}$ are integrated to a sensing voltage source 522. That is to say, the output sensing resistor $R_S$, the sensing voltage source 522, and the comparator 530 form the current sensing circuit CS. The sensing voltage source 522 is coupled between a second input of the comparator 530 and the first terminal of the output sensing resistor $R_S$. A first input of the comparator 530 is coupled to the second terminal of the output sensing resistor $R_S$. Thereby, the sensing voltage source 522 is an application of the reference voltage circuits 120A~120D as described above for supplying a negative reference voltage to the comparator 530. The output sensing resistor $R_S$ is used for sensing an output current $I_{OUT}$. The corresponding output voltage $V_{OUT}$ is located between the output sensing resistor $R_S$ and the output load LOAD. The current sensing circuit CS according to the present embodiment can be applied to a power meter or over current protection (OCP).

In addition to a resistor, the impedance device 104 described above can be a p-MOSFET or an n-MOSFET operating in the linear region, or a PNP BJT or an NPN BJT operating in the saturation region. The transimpedance device 106 described above can be the diode 106B, the PNP BJT 1064A, or the NON BJT 1065A. The current source 102 as described above can be the D-mode n-MOSFET 1022A or the D-mode p-MOSFET 1022B.

According to the above embodiments, the reference voltage circuit with temperature compensation according to the present application adopts a depletion-mode transistor as the current source. An impedance device provides a positive temperature coefficient voltage. A transimpedance device provides a negative temperature coefficient voltage. A reference voltage with temperature coefficient close to zero will be provided at the output terminal. Then the subsequent circuit can receive a reference voltage not influenced by temperature. In other words, the signal curves of any subsequent circuit are free from the influence of temperature by using the reference voltage.

Accordingly, the present application conforms to the legal requirements owing to its novelty, nonobviousness, and utility. However, the foregoing description is only embodiments of the present application, not used to limit the scope and range of the present application. Those equivalent changes or modifications made according to the shape, structure, feature, or spirit described in the claims of the present application are included in the appended claims of the present application.

What is claimed is:

1. A reference voltage circuit with temperature compensation, comprising:
    a current source, generating a positive temperature coefficient current;
    an impedance device, coupled to an output terminal, and generating a positive temperature coefficient voltage to said output terminal according to said positive temperature coefficient current;
    a current mirror, coupled to said current source and said impedance device, generating a current-mirror current to said impedance device according to said positive temperature coefficient current, and said impedance device generating said positive temperature coefficient voltage to said output terminal according to said current-mirror current; and
    a transimpedance device, generating a negative temperature coefficient voltage to said output terminal, and said output terminal outputting a reference voltage by canceling out said positive temperature coefficient voltage and said negative temperature coefficient voltage.

2. The reference voltage circuit with temperature compensation of claim 1, wherein said current source is a transistor, having a threshold voltage, and generating said positive temperature coefficient voltage.

3. The reference voltage circuit with temperature compensation of claim 2, wherein when said transistor is an n-type transistor, said threshold voltage is a negative threshold voltage; and when said transistor is a p-type transistor, said threshold voltage is a positive threshold voltage.

4. The reference voltage circuit with temperature compensation of claim 1, wherein when said current source is coupled a first voltage level, said transimpedance device is coupled to a second voltage level; when said current source is coupled a second voltage level, said transimpedance device is coupled to a first voltage level; and said second voltage level is smaller than said first voltage level.

5. The reference voltage circuit with temperature compensation of claim 1, wherein said current source is a depletion-mode transistor or a junction field-effect transistor.

6. The reference voltage circuit with temperature compensation of claim 1, wherein said current source is a first transistor; said impedance device is a second transistor; said first transistor generates said positive temperature coefficient current to said second transistor; and said second transistor generates said positive temperature coefficient voltage to said output terminal according to said positive temperature coefficient current.

7. The reference voltage circuit with temperature compensation of claim 6, wherein said first transistor is a depletion-mode transistor or a junction field-effect transistor; and said second transistor is an enhancement-mode transistor.

8. The reference voltage circuit with temperature compensation of claim 1, wherein said current source is a transistor; said impedance device is a resistor; said transimpedance device is a diode; a first terminal of said transistor is coupled to a second terminal of said resistor and a first terminal of said diode; a second terminal of said transistor is coupled to a first voltage terminal; a third terminal of said transistor is coupled to a first terminal of said resistor; and a second terminal of said diode is coupled to a second voltage terminal.

9. The reference voltage circuit with temperature compensation of claim 1, wherein said current source is a first transistor; said impedance device is a resistor; said transimpedance device is a second transistor; a first terminal of said first transistor is coupled to a second terminal of said resistor and a third terminal of said second transistor; a second terminal of said first transistor is coupled to a first voltage terminal; a third terminal of said first transistor is coupled to a first terminal of said resistor; and a first terminal and a second terminal of said second transistor are coupled to a second voltage terminal.

10. The reference voltage circuit with temperature compensation of claim 1, wherein said current source is a first transistor; said impedance device is a resistor; said transimpedance device is a second transistor; a first terminal of said first transistor is coupled to a second terminal of said resistor and a first terminal and a second terminal of said second transistor; a second terminal of said first transistor is coupled to a first voltage terminal; a third terminal of said first transistor is coupled to a first terminal of said resistor; and a third terminal of said second transistor are coupled to a second voltage terminal.

11. The reference voltage circuit with temperature compensation of claim 1, wherein said current source is a transistor and a first resistor; said impedance device is a second resistor; said transimpedance device is a diode; a first terminal of said transistor and a first terminal of said first resistor are coupled to a second voltage terminal; a second terminal of said transistor is coupled to said current mirror; a third terminal of said transistor is coupled to a first terminal of said first resistor; a first terminal of said second resistor is coupled to said current mirror; a second terminal of said second resistor is coupled to a first terminal of said diode; and a second terminal of said diode is coupled said second voltage terminal.

12. The reference voltage circuit with temperature compensation of claim 1, wherein said current source includes a first transistor and a first resistor; said impedance device is a second resistor; said transimpedance device is a second transistor; a first terminal of said first transistor and a second terminal of said first resistor are coupled to a second voltage terminal; a second terminal of said first transistor is coupled to said current mirror; a third terminal of said first transistor is coupled to a first terminal of said first resistor; a first terminal of said second resistor is coupled to said current mirror; a first terminal and a second terminal of said second transistor is coupled to said second voltage terminal; and a third terminal of said second transistor is coupled to a second terminal of said second resistor.

13. The reference voltage circuit with temperature compensation of claim 1, wherein said current source includes a depletion-mode transistor; said impedance device is a resistor; said transimpedance device is an enhancement-mode transistor; a first terminal of said depletion-mode transistor is coupled to a first terminal of said resistor and a first terminal and a second terminal of said enhancement-mode transistor; a third terminal of said enhance-mode transistor is coupled to a first voltage terminal; a second terminal of said resistor is coupled to a third terminal of said depletion-mode transistor; and a second terminal of said depletion-mode transistor is coupled to a second voltage terminal.

14. The reference voltage circuit with temperature compensation of claim 1, wherein said current source includes a depletion-mode transistor and a first resistor; said impedance device is a second resistor; said transimpedance device is an enhancement-mode transistor; a first terminal and a second terminal of said depletion-mode transistor are coupled to a first voltage terminal; a third terminal of said enhancement-mode transistor is coupled to a first terminal of said second resistor; a second terminal of said second resistor is coupled to a second terminal of said depletion-mode transistor; a third terminal of said depletion-mode transistor is coupled to a first terminal of said first resistor; and a first terminal of said depletion-mode transistor is coupled to a second terminal of said first resistor and a second voltage terminal.

15. A power supply unit, comprising:
a transformer, having a secondary side;
a current sensing circuit, coupled to said secondary side; and
a reference voltage circuit, coupled to said current sensing circuit, including:
a current source, generating a positive temperature coefficient current;
an impedance device, coupled to an output terminal, and generating a positive temperature coefficient voltage to said output terminal according to said positive temperature coefficient current, and said output terminal coupled to said current sensing circuit; and
a transimpedance device, generating a negative temperature coefficient voltage to said output terminal, and said output terminal outputting a reference voltage to said current sensing circuit by canceling out said positive temperature coefficient voltage and said negative temperature coefficient voltage.

16. The power supply unit of claim 15, and further comprising a load coupled to said current sensing circuit.

17. The power supply unit of claim 15, wherein said current sensing circuit includes:

a sensing device, having a first terminal coupled to said secondary side; and a comparator, having a first input and a second input, said first input coupled to said reference voltage and further coupled to said first terminal of sensing device, and said second input coupled to a second terminal of said sensing device.

18. A reference voltage circuit with temperature compensation, comprising:

a current source, generating a positive temperature coefficient current;

an impedance device, coupled to an output terminal, and generating a positive temperature coefficient voltage to said output terminal according to said positive temperature coefficient current; and a transimpedance device, generating a negative temperature coefficient voltage to said output terminal, and said output terminal outputting a reference voltage by canceling out said positive temperature coefficient voltage and said negative temperature coefficient voltage;

wherein said current source is a depletion-mode transistor or a junction field-effect transistor.

* * * * *